(12) United States Patent
Hahn et al.

(10) Patent No.: US 11,276,426 B2
(45) Date of Patent: Mar. 15, 2022

(54) MULTI-LAYER PZT MICROACTUATOR WITH ACTIVE PZT CONSTRAINING LAYERS FOR A DSA SUSPENSION

(71) Applicant: Magnecomp Corporation, Murrieta, CA (US)

(72) Inventors: Peter Hahn, Bangkok (TH); Kuen Chee Ee, Chino, CA (US); Long Zhang, Murrieta, CA (US)

(73) Assignee: Magnecomp Corporation, Murrieta, CA (US)

( * ) Notice: Subject to any disclaimer, the term of this patent is extended or adjusted under 35 U.S.C. 154(b) by 0 days.

(21) Appl. No.: 17/107,729

(22) Filed: Nov. 30, 2020

(65) Prior Publication Data

US 2021/0082459 A1 Mar. 18, 2021

Related U.S. Application Data

(63) Continuation of application No. 16/835,243, filed on Mar. 30, 2020, now Pat. No. 10,854,225, which is a
(Continued)

(51) Int. Cl.
*G11B 5/48* (2006.01)
*G11B 5/596* (2006.01)
*G11B 5/55* (2006.01)

(52) U.S. Cl.
CPC ............ *G11B 5/4873* (2013.01); *G11B 5/483* (2015.09); *G11B 5/4806* (2013.01); *G11B 5/596* (2013.01); *G11B 5/5552* (2013.01)

(58) Field of Classification Search
None
See application file for complete search history.

(56) References Cited

U.S. PATENT DOCUMENTS

| 3,390,287 A | 6/1968 | Sonderegger |
| 4,088,915 A | 5/1978 | Kodama |

(Continued)

FOREIGN PATENT DOCUMENTS

| CN | 1504998 A | 6/2004 |
| CN | 102449794 A | 5/2012 |

(Continued)

OTHER PUBLICATIONS

Aimmanee, Sontipee, Deformation and Force Characteristics of Laminated Piezoelectric Actuators, Dissertation at Virginia Polytechnic Institute and State University, 2004.
(Continued)

*Primary Examiner* — Carlos Garcia
(74) *Attorney, Agent, or Firm* — DLA Piper LLP (US)

(57) ABSTRACT

A PZT microactuator such as for a hard disk drive has a restraining layer bonded on its side that is opposite the side on which the PZT is mounted. The restraining layer comprises a stiff and resilient material such as stainless steel. The restraining layer can cover most or all of the top of the PZT, with an electrical connection being made to the PZT where it is not covered by the restraining layer. The restraining layer reduces bending of the PZT as mounted and hence increases effective stroke length, or reverses the sign of the bending which increases the effective stroke length of the PZT even further. The restraining layer can be one or more active layers of PZT material that act in the opposite direction as the main PZT layer. The restraining layer(s) may be thinner than the main PZT layer.

18 Claims, 21 Drawing Sheets

Related U.S. Application Data continuation of application No. 16/443,690, filed on Jun. 17, 2019, now Pat. No. 10,607,642, which is a continuation of application No. 15/055,618, filed on Feb. 28, 2016, now Pat. No. 10,325,621, which is a continuation of application No. 14/672,122, filed on Mar. 28, 2015, now Pat. No. 9,330,698, which is a continuation-in-part of application No. 14/566,666, filed on Dec. 10, 2014, now Pat. No. 9,330,694, which is a continuation-in-part of application No. 14/214,525, filed on Mar. 14, 2014, now Pat. No. 9,117,468, and a continuation-in-part of application No. 14/214,525, filed on Mar. 14, 2014, now Pat. No. 9,117,468.

(60) Provisional application No. 62/061,074, filed on Oct. 7, 2014, provisional application No. 61/877,957, filed on Sep. 14, 2013, provisional application No. 61/802,972, filed on Mar. 18, 2013, provisional application No. 62/085,471, filed on Nov. 28, 2014.

(56) References Cited

U.S. PATENT DOCUMENTS

| | | |
|---|---|---|
| 4,093,885 A | 6/1978 | Brown |
| 4,310,730 A | 1/1982 | Aaroe |
| 4,366,515 A | 12/1982 | Takano et al. |
| 4,443,729 A | 4/1984 | Rider |
| 4,633,122 A | 12/1986 | Radice |
| 4,769,570 A | 9/1988 | Yokoyama et al. |
| 5,376,860 A | 12/1994 | Sato |
| 5,402,159 A | 3/1995 | Takahashi et al. |
| 5,480,503 A | 1/1996 | Casey et al. |
| 5,485,053 A | 1/1996 | Baz |
| 5,632,841 A | 5/1997 | Hellbaum et al. |
| 5,712,758 A | 1/1998 | Amano et al. |
| 5,831,371 A | 11/1998 | Bishop |
| 5,849,125 A | 12/1998 | Clark |
| 5,861,702 A | 1/1999 | Bishop et al. |
| 5,883,651 A | 3/1999 | Thiel et al. |
| 6,060,811 A | 5/2000 | Fox et al. |
| 6,172,446 B1 | 1/2001 | Kanayama et al. |
| 6,245,172 B1 | 6/2001 | Face, Jr. |
| 6,278,587 B1 | 8/2001 | Mei |
| 6,326,718 B1 | 12/2001 | Boyd |
| 6,333,681 B1 | 12/2001 | Takeuchi et al. |
| 6,362,542 B1 | 3/2002 | Novotny |
| 6,421,211 B1 | 7/2002 | Hawwa et al. |
| 6,472,799 B2 | 10/2002 | Takeuchi et al. |
| 6,476,538 B2 | 11/2002 | Takeuchi et al. |
| 6,512,323 B2 | 1/2003 | Forck et al. |
| 6,538,854 B2 | 3/2003 | Koganezawa et al. |
| 6,605,887 B2 | 8/2003 | Takeuchi et al. |
| 6,614,144 B2 | 9/2003 | Vazquez Carazo |
| 6,618,220 B2 | 9/2003 | Inagaki et al. |
| 6,636,387 B2 | 10/2003 | Kikkawa et al. |
| 6,643,902 B2 | 11/2003 | Takeuchi et al. |
| 6,716,363 B1 | 4/2004 | Wright et al. |
| 6,726,984 B2 | 4/2004 | Natarajan et al. |
| 6,762,536 B2 | 7/2004 | Hoffmann et al. |
| 6,812,594 B2 | 11/2004 | Face et al. |
| 6,817,072 B2 | 11/2004 | Takeuchi et al. |
| 6,817,073 B2 | 11/2004 | Uchiyama et al. |
| 6,847,155 B2 | 1/2005 | Schwartz et al. |
| 7,085,092 B2 | 8/2006 | Koganezawa |
| 7,126,497 B2 | 10/2006 | Face et al. |
| 7,164,221 B1 | 1/2007 | Takeuchi et al. |
| 7,218,481 B1 | 5/2007 | Bennin et al. |
| 7,245,064 B2 | 7/2007 | Takeuchi et al. |
| 7,336,021 B2 | 2/2008 | Takeuchi et al. |
| 7,358,647 B2 | 4/2008 | Takeuchi et al. |
| 7,368,860 B2 | 5/2008 | Wood et al. |
| 7,382,583 B2 | 6/2008 | Hirano et al. |
| 7,440,236 B1 | 10/2008 | Bennin et al. |
| 7,459,835 B1 | 12/2008 | Mei et al. |
| 7,595,965 B1 | 9/2009 | Kulangara et al. |
| 7,652,412 B2 | 1/2010 | Nihei |
| 7,671,519 B2 | 3/2010 | Kear et al. |
| 7,692,559 B2 | 4/2010 | Face et al. |
| 7,746,279 B2 | 6/2010 | McGovern et al. |
| 7,781,679 B1 | 8/2010 | Schreiber et al. |
| 7,872,834 B1 | 1/2011 | Pokornowski et al. |
| 7,983,008 B2 | 7/2011 | Liao et al. |
| 8,004,159 B2 | 8/2011 | Nihei |
| 8,085,508 B2 | 12/2011 | Hatch |
| 8,148,791 B1 | 4/2012 | Holaway |
| 8,149,545 B1 | 4/2012 | Chai et al. |
| 8,189,296 B2 | 5/2012 | Hata et al. |
| 8,189,301 B2 | 5/2012 | Schreiber |
| 8,395,866 B1 | 3/2013 | Schreiber et al. |
| 8,570,688 B1 | 10/2013 | Hahn et al. |
| 8,680,749 B2 | 3/2014 | Xu et al. |
| 8,681,456 B1 | 3/2014 | Miller et al. |
| 8,699,186 B1 | 4/2014 | Hahn et al. |
| 8,773,820 B1 | 7/2014 | Hahn et al. |
| 8,780,503 B2 | 7/2014 | Wright et al. |
| 8,810,113 B2 | 8/2014 | Han et al. |
| 8,810,972 B1 | 8/2014 | Dunn |
| 8,879,210 B1 | 11/2014 | Hahn et al. |
| 9,070,394 B1 | 6/2015 | Hahn et al. |
| 9,117,468 B1 | 8/2015 | Zhang et al. |
| 9,318,136 B1 | 4/2016 | Bjorstrom et al. |
| 9,330,694 B1 | 5/2016 | Hahn et al. |
| 9,330,696 B1 | 5/2016 | Hahn et al. |
| 9,330,698 B1 | 5/2016 | Hahn et al. |
| 9,330,699 B1 | 5/2016 | Hahn et al. |
| 9,390,739 B1 | 7/2016 | Zhang et al. |
| 9,741,376 B1 | 8/2017 | Ee et al. |
| 10,074,390 B1 | 9/2018 | Hahn et al. |
| 10,128,431 B1 | 11/2018 | Dunn et al. |
| 10,236,022 B2 | 3/2019 | Ee et al. |
| 10,325,621 B1 | 6/2019 | Hahn et al. |
| 10,607,642 B2 | 3/2020 | Hahn et al. |
| 10,854,225 B2 | 12/2020 | Hahn et al. |
| 11,011,195 B2 | 5/2021 | Ee et al. |
| 2001/0050833 A1 | 12/2001 | Murphy et al. |
| 2002/0063496 A1 | 5/2002 | Forck et al. |
| 2002/0105750 A1 | 8/2002 | Li et al. |
| 2003/0137777 A1 | 7/2003 | Boutaghou et al. |
| 2004/0049900 A1 | 3/2004 | Emery et al. |
| 2004/0095663 A1 | 5/2004 | Kuwajima et al. |
| 2004/0251784 A1 | 12/2004 | Kuniyasu |
| 2007/0007863 A1 | 1/2007 | Mohr, III |
| 2007/0084034 A1 | 4/2007 | Omura et al. |
| 2007/0222339 A1 | 9/2007 | Lukacs et al. |
| 2009/0051245 A1 | 2/2009 | Takayama et al. |
| 2009/0080116 A1 | 3/2009 | Takahashi et al. |
| 2009/0096321 A1 | 4/2009 | Aikawa et al. |
| 2009/0195938 A1 | 8/2009 | Yao et al. |
| 2010/0195251 A1 | 8/2010 | Nojima et al. |
| 2010/0271735 A1 | 10/2010 | Schreiber |
| 2010/0276511 A1 | 11/2010 | Okamura |
| 2011/0279929 A1 | 11/2011 | Kin |
| 2012/0200198 A1 | 8/2012 | Yamamoto |
| 2012/0216378 A1 | 8/2012 | Emley et al. |
| 2013/0320811 A1 | 12/2013 | Mizusawa et al. |
| 2014/0008101 A1 | 1/2014 | Brandts et al. |
| 2014/0104722 A1 | 4/2014 | Wright et al. |
| 2014/0111062 A1 | 4/2014 | Bauer et al. |
| 2016/0056366 A1 | 2/2016 | Nakamura |
| 2019/0081232 A1 | 3/2019 | Dunn et al. |
| 2019/0228796 A1* | 7/2019 | Ee ................ H01L 41/0933 |
| 2019/0237652 A1 | 8/2019 | Harada |
| 2020/0243745 A1 | 7/2020 | Ishizaki et al. |
| 2020/0327904 A1 | 10/2020 | Glaess et al. |
| 2021/0272592 A1 | 9/2021 | Ee et al. |

FOREIGN PATENT DOCUMENTS

| | | |
|---|---|---|
| CN | 102741958 A | 10/2012 |
| CN | 103688318 A | 3/2014 |
| JP | 59-178899 A | 10/1984 |
| JP | 62-104182 A | 5/1987 |

(56) References Cited

FOREIGN PATENT DOCUMENTS

| JP | 6-232469 A | 8/1994 |
|---|---|---|
| JP | 2001-339967 A | 12/2001 |
| JP | 2009-65760 A | 3/2009 |
| JP | 2009-205723 A | 9/2009 |
| JP | 2010-103811 A | 5/2010 |
| JP | 2017-17241 A | 1/2017 |
| WO | WO 2006/073018 A1 | 7/2006 |
| WO | WO 2015/060132 A1 | 4/2015 |

OTHER PUBLICATIONS

Batra, R.C. and Geng, T.S., Enhancement of the Dynamic Buckling Load for a Plate by Using Piezoceramic Actuators, Smart Materials and Structures (2001), vol. 10, pp. 925-933.
Capozzoli, M. et al., Modeling Aspects Concerning THUNDER Actuators, Proceedings of the SPIE, Smart Structures and Materials 1999, vol. 3667, pp. 719-727.
Finio, Benjamin M. and Wood, Robert J., Optimal Energy Density Piezoelectric Twisting Actuators, 2011 IEEE/RJS International Conference on Intelligent Robots and Systems, Sep. 25-30, 2011, p. 384-389.
Luo, Quantian and Tong, Liyong, Exact Static Solutions to Piezoelectric Smart Beams Including Peel Stresses, International Journal of Solids and Structures (2002), vol. 39, pp. 4677-4695.
Kim, Sunghwan, Low Power Energy Harvesting with Piezoelectric Generators, PhD Thesis, 2002, University of Pittsburgh, esp. Fig. 27 (p. 51) and related discussion.
PI Ceramic GmbH (Germany), Displacement Modes of Piezoelectric Actuators, © 1996-2015, retrieved in 2015 from http://piceramic.com/piezo-technology/properties-piezo-actuators/displacement-modes.html, esp. p. 4 ff.
Phillips, James R., Piezoelectric Technology Primer, date unknown, CTS Wireless Components, Albuquerque, New Mexico, retrieved in 2015 from http://www.ctscorp.com/components/pzt/downloads/Piezoelectric_Technology.pdf, esp. pp. 8-11.
Smits, Jan G. and Dalke, Susan I., The Constituent Equations of Piezoelectric Bimorphs, IEEE 1989 Ultrasonics Symposium, pp. 781-784.
International Search Report and Written Opinion in International Application No. PCT/US2021/028474, dated May 12, 2021.
Notice of Allowance in U.S. Appl. No. 15/227,780, dated Apr. 14, 2017.
Office Action in Chinese Application No. 201710654540.5, dated May 27, 2020.
Office Action in U.S. Appl. No. 15/682,299, dated Sep. 25, 2017.
Office Action in U.S. Appl. No. 15/682,299, dated May 8, 2018.
Notice of Allowance in U.S. Appl. No. 15/682,299, dated Nov. 2, 2018.
Office Action in U.S. Appl. No. 16/357,181, dated Apr. 30, 2020.
Office Action in U.S. Appl. No. 16/357,181, dated Oct. 1, 2020.
Notice of Allowance in U.S. Appl. No. 16/357,181, dated Jan. 22, 2021.
Office Action in U.S. Appl. No. 14/566,666, dated May 27, 2015.
Office Action in U.S. Appl. No. 14/720,827, dated Oct. 2, 2015.
Office Action in U.S. Appl. No. 14/672,122, dated Jul. 16, 2015.
Office Action in U.S. Appl. No. 15/055,618, dated Jan. 3, 2017.
Office Action in U.S. Appl. No. 15/055,618, dated Oct. 3, 2017.
Office Action in U.S. Appl. No. 15/055,618, dated Apr. 19, 2018.
Notice of Allowance in U.S. Appl. No. 15/055,618, dated Jan. 31, 2019.
Supplemental Notice of Allowance in U.S. Appl. No. 15/055,618, dated Feb. 21, 2019.
Office Action in U.S. Appl. No. 15/055,633, dated Sep. 27, 2017.
Notice of Allowance in U.S. Appl. No. 15/055,633, dated May 3, 2018.
Corrected Notice of Allowance in U.S. Appl. No. 15/055,633, dated May 17, 2018.
Corrected Notice of Allowance in U.S. Appl. No. 15/055,633, dated Jun. 5, 2018.
Corrected Notice of Allowance in U.S. Appl. No. 15/055,633, dated Aug. 10, 2018.
Office Action in U.S. Appl. No. 16/443,690, dated Aug. 7, 2019.
Notice of Allowance in U.S. Appl. No. 16/443,690, dated Nov. 21, 2019.
Notice of Allowance in U.S. Appl. No. 16/835,243, dated Jul. 29, 2020.
Office Action in U.S. Appl. No. 16/857,133, dated Jul. 21, 2020.
Office Action in U.S. Appl. No. 16/857,133, dated Dec. 28, 2020.
Office Action in U.S. Appl. No. 16/857,133, dated Apr. 5, 2021.
Office Action in U.S. Appl. No. 14/745,417, dated Jun. 14, 2017.
Office Action in U.S. Appl. No. 14/745,417, dated Nov. 16, 2017.
Notice of Allowance in U.S. Appl. No. 14/745,417, dated Jul. 18, 2018.
Supplemental Notice of Allowance in U.S. Appl. No. 14/745,417, dated Aug. 6, 2018.
Notice of Reasons for Refusal in Japanese Application No. 2017-149136, dated Aug. 3, 2021.
Notice of Allowance in U.S. Appl. No. 16/857,133, dated Aug. 13, 2021.
Corrected Notice of Allowance in U.S. Appl. No. 16/857,133, dated Aug. 25, 2021.
Office Action in U.S. Appl. No. 16/186,408, dated Jun. 14, 2021.
Office Action in U.S. Appl. No. 16/186,408, dated Oct. 1, 2021.

* cited by examiner

*FIG. 5*
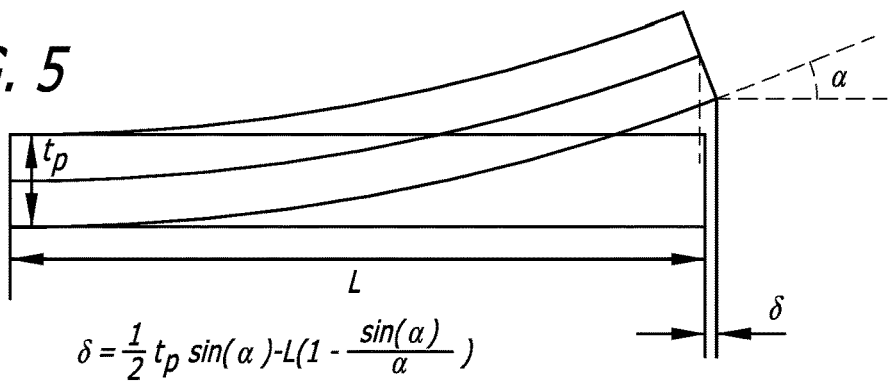
$$\delta = \frac{1}{2} t_p \sin(\alpha) - L\left(1 - \frac{\sin(\alpha)}{\alpha}\right)$$
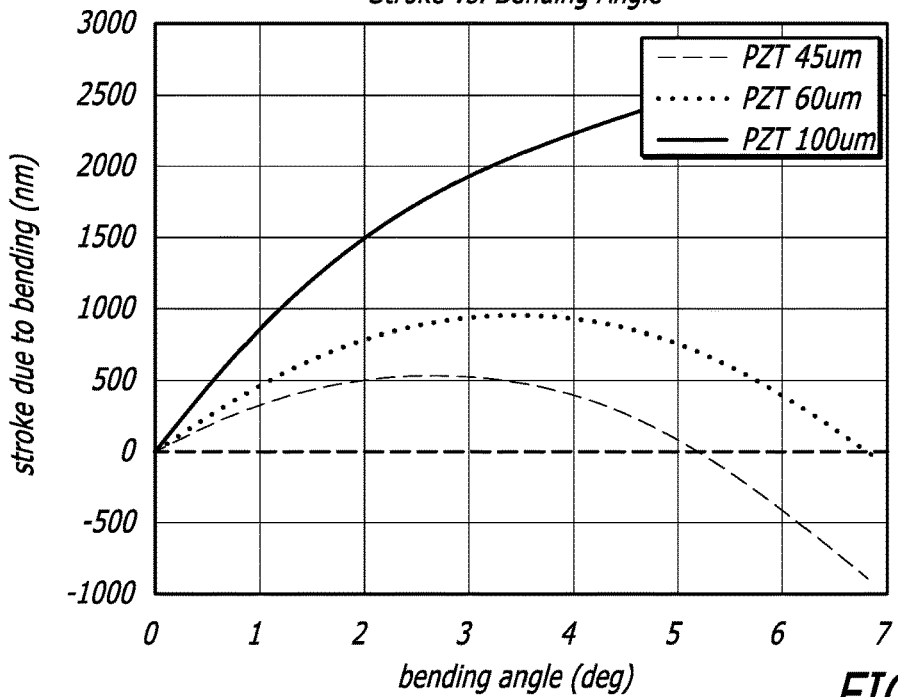
*FIG. 6*
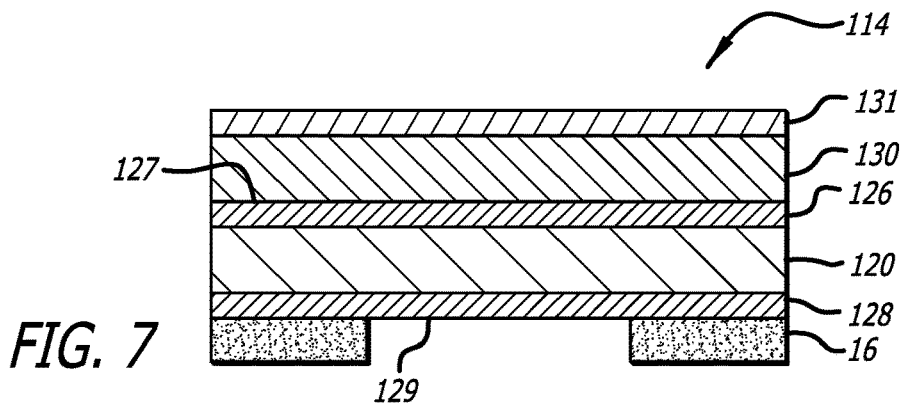
*FIG. 7*

| THICKNESS (EACH LAYER), um | | | | | | |
|---|---|---|---|---|---|---|
| | 5 | 10 | 15 | 20 | 30 | 40 |
| PASSIVE CLC | | 11.2 | 12.2 | 12.9 | 13.5 | 13.4 |
| SINGLE LAYER | 23.9 | 24.2 | 23.9 | 23.2 | 21.2 | 19.0 |
| DOUBLE LAYER | 38.0 | 34.2 | 29.5 | 25.0 | 18.1 | |

MULTI-LAYER PZT MICROACTUATOR WITH ACTIVE PZT CONSTRAINING LAYERS FOR A DSA SUSPENSION

CROSS-REFERENCE TO RELATED APPLICATIONS

This application is a continuation of U.S. patent application Ser. No. 16/835,243 filed Mar. 30, 2020, which is a continuation of U.S. patent application Ser. No. 16/443,690 filed Jun. 17, 2019, now U.S. Pat. No. 10,607,642, which is a continuation of U.S. patent application Ser. No. 15/055,618 filed Feb. 28, 2016, now U.S. Pat. No. 10,325,621, which is a continuation of U.S. patent application Ser. No. 14/672,122 filed Mar. 28, 2015, now U.S. Pat. No. 9,330,698, which is a continuation-in-part of U.S. patent application Ser. No. 14/566,666 filed Dec. 10, 2014, now U.S. Pat. No. 9,330,694 which claims benefit of U.S. Provisional Patent Application No. 62/061,074 filed Oct. 7, 2014, and which is a continuation-in-part of U.S. patent application Ser. No. 14/214,525 filed Mar. 14, 2014, now U.S. Pat. No. 9,117,468, which claims the benefit of U.S. Provisional Patent Application No. 61/877,957 filed Sep. 14, 2013 and of U.S. Provisional Patent Application No. 61/802,972 filed Mar. 18, 2013. Application Ser. No. 14/672,122 is also a continuation-in-part of U.S. patent application Ser. No. 14/214,525 filed Mar. 14, 2014. Application Ser. No. 14/672,122 also claims the benefit of U.S. Provisional Patent Application No. 62/085,471 filed Nov. 28, 2014. All of those applications are incorporated by reference as if set forth fully herein.

BACKGROUND OF THE INVENTION

1. Field of the Invention

This invention relates to the field of suspensions for hard disk drives. More particularly, this invention relates to the field of multi-layer piezoelectric microactuator having one or more active piezoelectric constraining layers for use in a dual stage actuated suspension.

2. Description of Related Art

Magnetic hard disk drives and other types of spinning media drives such as optical disk drives are well known. FIG. 1 is an oblique view of an exemplary prior art hard disk drive and suspension for which the present invention is applicable. The prior art disk drive unit 100 includes a spinning magnetic disk 101 containing a pattern of magnetic ones and zeroes on it that constitutes the data stored on the disk drive. The magnetic disk is driven by a drive motor (not shown). Disk drive unit 100 further includes a disk drive suspension 105 to which a magnetic head slider (not shown) is mounted proximate the distal end of load beam 107. The "proximal" end of a suspension or load beam is the end that is supported, i.e., the end nearest to base plate 12 which is swaged or otherwise mounted to an actuator arm. The "distal" end of a suspension or load beam is the end that is opposite the proximal end, i.e., the "distal" end is the cantilevered end.

Suspension 105 is coupled to an actuator arm 103, which in turn is coupled to a voice coil motor 112 that moves the suspension 105 arcuately in order to position the head slider over the correct data track on data disk 101. The head slider is carried on a gimbal which allows the slider to pitch and roll so that it follows the proper data track on the spinning disk, allowing for such variations as vibrations of the disk, inertial events such as bumping, and irregularities in the disk's surface.

Both single stage actuated disk drive suspensions and dual stage actuated (DSA) suspension are known. In a single stage actuated suspension, only the voice coil motor 112 moves suspension 105.

In a DSA suspension, as for example in U.S. Pat. No. 7,459,835 issued to Mei et al. as well as many others, in addition to a voice coil motor 112 which moves the entire suspension, at least one additional microactuator is located on the suspension in order to effect fine movements of the magnetic head slider and to keep it properly aligned over the data track on the spinning disk. The microactuator(s) provide finer control and much higher bandwidth of the servo control loop than does the voice coil motor alone, which only effects relatively coarse movements of the suspension and hence the magnetic head slider. A piezoelectric element, sometimes referred to simply as a PZT, is often used as the microactuator motor, although other types of microactuator motors are possible.

FIG. 2 is a top plan view of the prior art suspension 105 in FIG. 1. Two PZT microactuators 14 are affixed to suspension 105 on microactuator mounting shelves 18 that are formed within base plate 12, such that the PZTs span respective gaps in base plate 12. Microactuators 14 are affixed to mounting shelves 18 by epoxy 16 at each end of the microactuators. The positive and negative electrical connections can be made from the PZTs to the suspension's flexible wiring trace and/or to the plate by a variety of techniques. When microactuator 14 is activated, it expands or contracts and thus changes the length of the gap between the mounting shelves thereby producing fine movements of the read/write head that is mounted at the distal end of suspension 105.

FIG. 3 is a side sectional view of the prior art PZT microactuator and mounting of FIG. 2. Microactuator 14 includes the PZT element 20 itself, and top and bottom metalized layers 26, 28 on the PZT which define electrodes for actuating the PZT. PZT 14 is mounted across a gap by epoxy or solder 16 on both its left and right sides as shown in the figure.

In DSA suspensions it is generally desirable to achieve a high stroke distance from the PZT per unit of input voltage, or simply "stroke length" for short.

Many DSA suspension designs in the past have mounted the PZTs at the mount plate. In such a design, the linear movement of the PZTs is magnified by the length of the arm between the rotation center of the PZTs and the read/write transducer head. A small linear movement of the PZTs therefore results in a relatively large radial movement of the read/write head.

Other suspension designs mount the PZT at or near the gimbal. An example of a gimbal-mounted PZT is the DSA suspension shown in co-pending U.S. application Ser. No. 13/684,016 which is assigned to the assignee of the present invention. In a gimbal-mounted DSA suspension (a "GSA" suspension) it is particularly important to achieve high stroke length, because those designs do not have nearly as long an arm length between the PZTs and the read/write transducer head. With a shorter arm length, the resulting movement of the read/write head is correspondingly less. Thus, achieving a large stroke length is particularly important in GSA design.

SUMMARY OF THE INVENTION

The inventors of the application have identified a source of lost PZT stroke length in a suspension having a PZT microactuator mounted thereto according to the prior art, and have developed a PZT microactuator structure and method of producing it that eliminates the source of that lost stroke length.

FIG. 4A is a side sectional view of a PZT microactuator 14 mounted in a suspension according to prior art FIG. 2, when the PZT is actuated by a driving voltage applied thereto in order to expanded the PZT. Because the bottom layer 22 of the PZT is partially constrained by being bonded to the suspension 18 on which it is mounted, the bottom layer 22 does not expand in a linear direction as much as does the top layer 24. Because the top layer 24 expands more than does the bottom layer 22, the PZT 14 bends downward and assumes a slightly convex shape when viewed from the top. The resulting loss in linear stroke length is shown in the figure as $\delta 1$.

FIG. 4B shows the PZT microactuator 14 of FIG. 4A when the PZT is actuated by a driving voltage applied thereto to contract the PZT. Because the bottom layer 22 of the PZT is partially constrained by being bonded to the suspension 18 on which it is mounted, the bottom layer 22 does not contract in a linear direction as much as does the top layer 24. Because the top layer 24 contracts more than does the bottom layer 22, the PZT 14 bends upward and assumes a slightly concave shape when viewed from the top. The resulting loss in linear stroke length is shown in the figure as $\delta 2$.

Thus, although purely linear expansion and contraction of the PZT upon actuation is desired, in the conventional mounting the PZT experiences bending either up or down which results in lost stroke length.

FIG. 5 is a diagram and an associated equation for the amount of effective linear stroke added or lost due to bending of a PZT. When the beam bends up as shown in FIG. 4A the bottom tip point will have a positive displacement $\delta$ in the x-direction when the bending angle is small.

FIG. 6 is a plot of stroke loss due to bending verses bending angle for three different thicknesses of PZTs. As shown in the figure, for a PZT with a length of 1.50 mm and a thickness of 45 μm, the bending causes a positive x-displacement $\delta$ when the bending angle is less than 5 degrees. For that amount of bending, it can also been seen that thicker beams produce greater x-displacement than do thinner beams. Similarly, when the PZT contracts under the applied voltage, the right half of the PZT bends downward, and the bottom tip of the PZT which is bonded to the suspension will experience a negative x-displacement. In other words, in the conventional mounting of a PZT onto a suspension, the component $\delta$ of linear displacement due to bending is in the opposite direction as the actuation of the PZT. It would therefore be desirable to reduce or eliminate that delta, or to even reverse the sign of that delta so that the net result is that the amount of total linear expansion or contraction is actually increased.

The present invention is of a PZT element that has one or more stiff restraining layers or restraining elements bonded onto at least one side or face opposite the side or face on which the PZT is mounted to the suspension, in order to reduce, eliminate, change the direction of, or otherwise control bending of the PZT when it is actuated. The counterintuitive result is that even though the PZT has an stiff layer added to it that, at least nominally, restrains the expansion and contraction of the PZT, the effective linear stroke distance achieved actually increases. A PZT having a restraining layer according to the invention can be used as a microactuator in a hard disk drive suspension, although it could be used in other applications as well.

In a preferred embodiment the effect of the restraining layer is to actually change the direction of bending. Thus, for a PZT that is bonded on its bottom surface to the suspension, the presence of the restraining layer has the effect that when the piezoelectric element is actuated by a voltage that causes the piezoelectric element to expand, the piezoelectric element bends in a direction that causes the top face to become net concave in shape; and when the piezoelectric element is actuated by a voltage that causes the piezoelectric element to contract, the piezoelectric element bends in a direction that causes the top face to become net convex in shape. The effect is therefore to actually increase the effective linear expansion in expansion mode, and to increase the effective linear contraction in contraction mode. The presence of the restraining layer therefore actually increases the effective stroke length.

The PZT with its constraining layer can be manufactured by various techniques including laminating the constraining layer to an existing PZT element, or one of the PZT element and the constraining layer can be formed on top of the other by an additive process. Such an additive process can include depositing a thin film PZT onto a substrate such as stainless steel (SST). The constraining layer can be stainless steel, silicon, ceramic such as substantially unpoled (unactivated) ceramic material of otherwise the same ceramic material as constitutes the PZT element, or another relatively stiff material. If the restraining layer is non-conductive, one or more electrical vias comprising columns of conductive material can be formed through the restraining layer in order to carry the activating voltage or ground potential from the surface of the microactuator to the PZT element inside.

The constraining layer may be larger (of greater surface area) than the PZT element, the same size as the PZT element, or may be smaller (of lesser surface area) than the PZT element. In a preferred embodiment, the constraining layer is smaller than the PZT element, giving the microactuator a step-like structure with the shelf of the step uncovered by the restraining layer, and with the shelf being where the electrical connection is made to the PZT element. One benefit of such a construction including a shelf where the electrical connection is made is that the completed assembly including the electrical connection has a lower profile than if the restraining layer covers the entire PZT. A lower profile is advantageous because it means that more hard drive platters and their suspensions can be stacked together within a given platter stack height, thus increasing the data storage capacity within a given volume of disk drive assembly.

Simulations have shown that microactuators constructed according to the invention exhibit enhanced stroke sensitivity, and also exhibited reduced sway mode gain and torsion mode gain. These are advantageous in increasing head positioning control loop bandwidth, which translates into both lower data seek times and lower susceptibility to vibrations.

An additional advantage of adding a constraining layer(s) or element(s) to the PZT according to the invention is that in hard disk drives today, the suspension and its components including the PZT are usually very thin. Microactuators used in today's DSA suspension designs in which the PZTs are mounted at the mount plate, are on the order of 150 μm thick. In gimbal-mounted DSA suspension designs the PZTs are even thinner, often being less than 100 μm thick. The PZT material is therefore very thin and brittle, and can crack easily during both manufacturing/assembly, including both the process of manufacturing the PZT microactuator motor itself as well as the automated pick-and-place operation in the suspension assembly process. It is expected that PZTs in future generation hard drives will be 75 µm thick or thinner, which will exacerbate the problem. It is anticipated that PZTs this thin will not only be susceptible to damage during manufacturing/assembly, but could also be vulnerable to cracking or breaking when the disk drive experiences shock, i.e., g-forces. The additional stiff, resilient constraining layer according to the present invention provides additional strength and resiliency to the PZT thus helping to prevent the PZT from cracking or otherwise mechanically failing during manufacturing/assembly and during shock events.

In another aspect of the invention, a microactuator assembly is a multi-layer PZT device, with multiple active PZT layers including one or more active PZT layers acting as restraining layers that tend to counteract the action of the main active PZT layer.

The idea that by adding one or more layers that resist the main PZT layer's movement, overall net stroke length can be increased, is counterintuitive. It is even more counterintuitive to think that by adding one or more active layers that actively act in the opposite direction as the main PZT layer, overall net stroke length can be increased even further. Nevertheless, that is the result which the present inventors have demonstrated.

Exemplary embodiments of the invention will be further described below with reference to the drawings, in which like numbers refer to like parts. The drawing figures might not be to scale, and certain components may be shown in generalized or schematic form and identified by commercial designations in the interest of clarity and conciseness.

BRIEF DESCRIPTION OF THE DRAWINGS

FIG. 5 is a diagram and an associated equation for the amount of linear stroke added or lost due to bending of a PZT.

FIG. 6 is a plot of stroke loss due to bending verses bending angle for three different thicknesses of PZTs.

FIG. 7 is a side sectional view of a PZT having a constraining layer bonded thereto in accordance with the present invention.

DETAILED DESCRIPTION OF THE PREFERRED EMBODIMENTS

Figure 1:
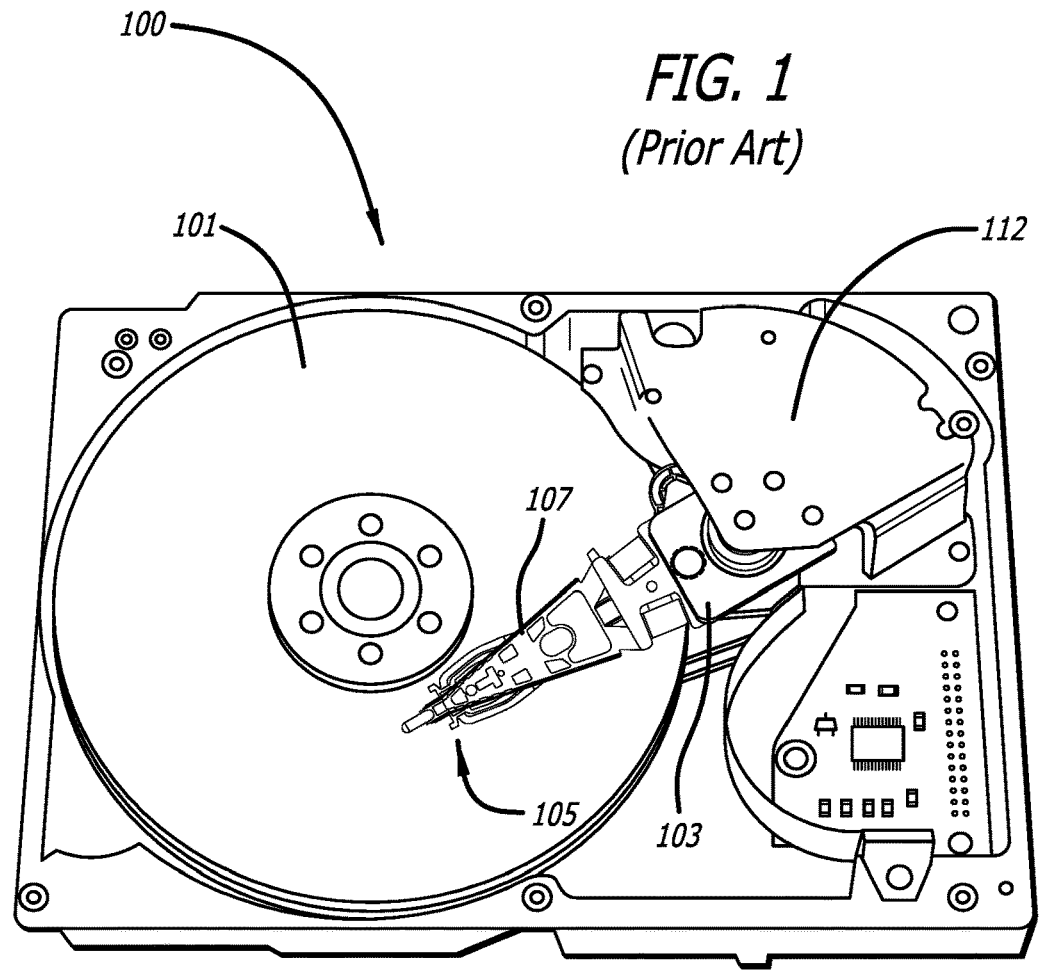
FIG. 1 is a top perspective view of a prior art magnetic hard disk drive.
Figure 2:
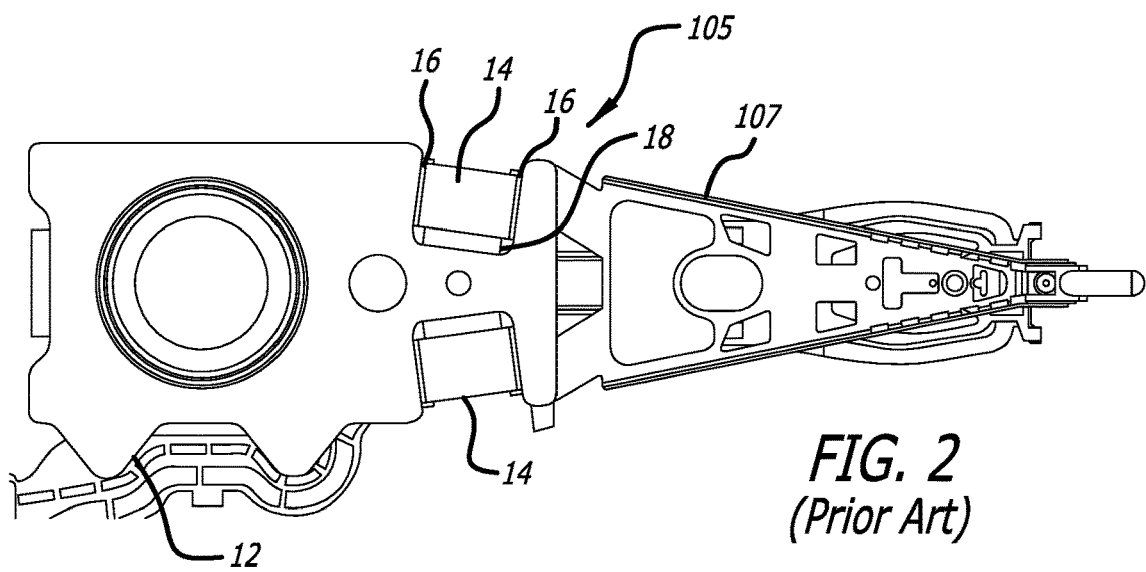
FIG. 2 is a top plan view of the suspension of the disk drive of FIG. 1.
Figure 3:
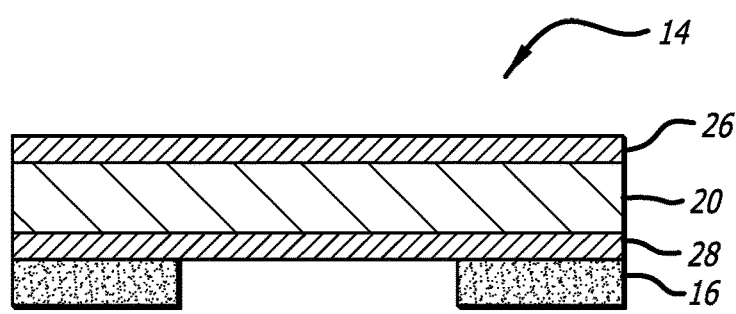
FIG. 3 is a side sectional view of the prior art PZT microactuator and mounting of FIG. 2.

FIG. 7 is a side sectional view of a PZT microactuator assembly 114 having a constraining layer 130 bonded thereto in accordance with an embodiment of present invention. In keeping with the orientation shown in the figure, the side of the PZT which is bonded to the suspension will be referred to as the bottom side 129 of PZT 114, and the side of the PZT away from the side at which the PZT is bonded to the suspension will be referred to as the top side 127. According to the invention, one or more constraining layers or constraining elements 130 is bonded to the top side 127 of microactuator PZT element 120. The constraining layer 130 preferably comprises a stiff and resilient material such as stainless steel and is preferably bonded directly to the top surface 127 of the PZT element 120 including its top electrode 126, or the SST material may itself serve as the top electrode thus making it unnecessary to separately metalize the top surface. The constraining layer 130 is stiff enough so as to significantly reduce, eliminate, or even reverse the bending of the PZT when actuated. The SST layer 130 preferably has a layer 131 of gold or other contact metal in order to ensure a good electrical connection to the SST.

Alternatively, instead of the constraining layer 130 being stainless steel, it could be ceramic such as an unactivated (unpoled, or unpolarized) layer of the same ceramic material as forms the piezoelectric layer 120, and could be integrated into the assembly by either bonding or by deposition. The ceramic material is unpolarized meaning that it exhibits substantially less piezoelectric behavior, such as less than 10% as much piezoelectric behavior, as the poled ceramic that defines piezoelectric layer 120. Such an assembly, defining a stack consisting from the bottom up of electrode/poled PZT/electrode/unpoled PZT, may be easier to manufacture than a stack of electrode/PZT/electrode/SST.

In the discussion that follows, for simplicity of discussion top and bottom electrodes 126, 128 are sometimes omitted from the figures and from the discussion, it being understood that PZT microactuators will almost always have at least some type of top and bottom electrode.

A layer of copper or nickel may be deposited onto the SST layer 130 before gold layer 131 is applied in order to increase the adhesion of the gold to the SST, as discussed in U.S. Pat. No. 8,395,866 issued to Schreiber et al. which is owned by the assignee of the present application, and which is hereby incorporated by reference for its teaching of electrodepositing other metals onto stainless steel. Similarly, the electrodes 126, 128 may comprise a combination of nickel and/or chromium, and gold (NiCr/Au).

124-167 (FIG. 5). In one illustrative embodiment according to a simulation, the thicknesses of the various layers were:

| 130 | PZT | 3 µm |
|---|---|---|
| 126, 128, 131 | NiCr/Au | 0.5 µm |

The thin film PZT had a length of 1.20 mm, the PZT bonding had a width of 0.15 mm at both ends, and the piezoelectric coefficient d31 was 250 pm/V. In some embodiments, the SST layer may be at least 12 micrometers thick in order to provide adequate support.

In the above example the DSA suspension exhibited a stroke sensitivity of 26.1 nm/V according to a simulation. In contrast, a 45 µm thick bulk PZT (d31=320 pm/V) with the same geometry would typically exhibit a stroke sensitivity of only 7.2 nm/V.

The ratio of thicknesses of the SST layer to the PZT layer may be as high as 1:1, or even 1.25:1 or even higher. As the thickness ratio of the constraint layer to the PZT reaches approximately 1:25, the stroke sensitivity improvement due to the constraint layer may start to be negative, indicating the thickness limitation of the PZT constraint layer.

Figure 8A:
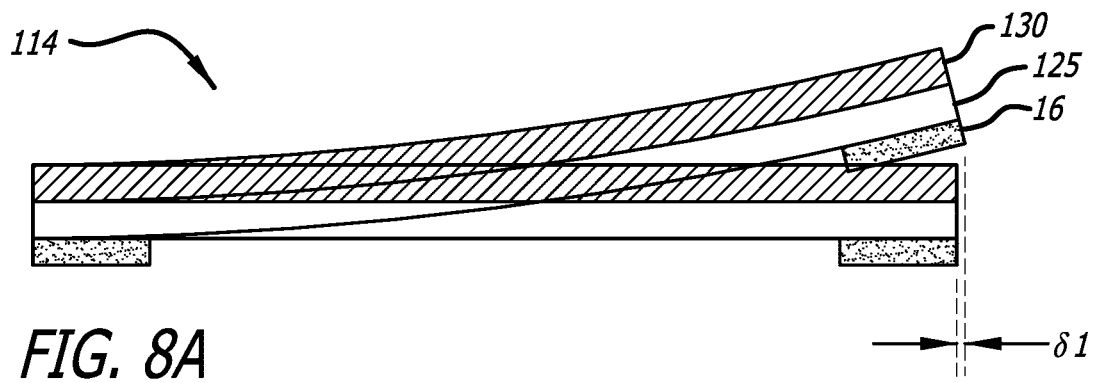
FIG. 8A is a side sectional view of the PZT microactuator of FIG. 8 when a voltage is applied to the PZT so as to expand it.

FIG. 8A is a side sectional view of a PZT microactuator 114 of FIG. 7 when a voltage is applied to the PZT so as to expand it. The PZT stroke consists of two vectors, one that is the pure extension stroke δe, the other is the extension contribution δ1 due to the constraining layer causing the PZT's right tip to bend upward, instead of bending downward as would be the case without the restraining layer. The total stroke length is δe+δ1. In expansion mode therefore, the PZT assumes a slightly concave shape when viewed from the top, i.e. the PZT top surface assumes a slightly concave shape, which is in a bending direction that is the opposite from the bending of the prior art PZT of FIG. 4. That bending according to the invention therefore adds to the effective stroke length rather than subtracting from it.

Figure 8B:
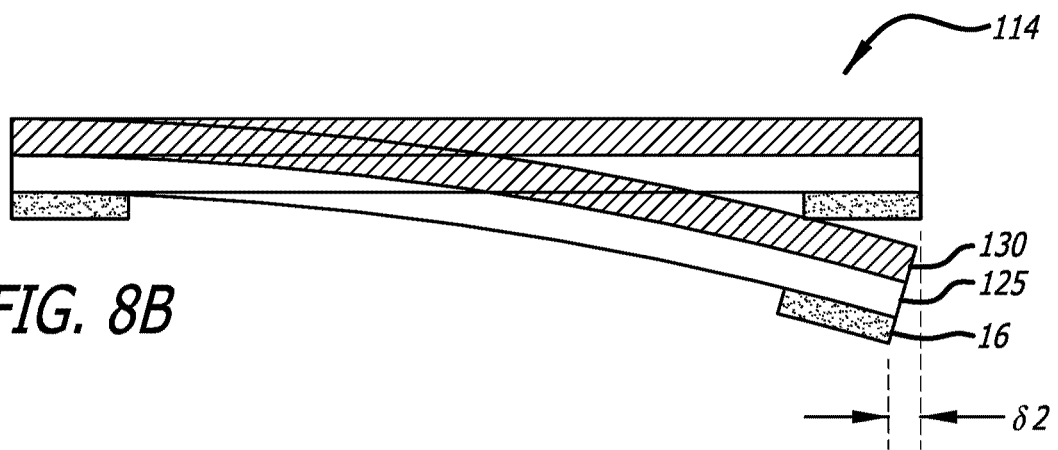
FIG. 8B is a side sectional view of a PZT microactuator of FIG. 8 when a voltage is applied to the PZT so as to contract it.

FIG. 8B is a side sectional view of a PZT microactuator of FIG. 7 when a voltage is applied to the PZT 114 so as to contract it. The PZT stroke consists of two vectors, one that is the pure contraction stroke −|δc|, the other is the contraction contribution δ2 due to the constraining layer causing the PZT's right tip to bend downward, instead of bending upward as would be the case without the restraining layer. The total stroke length is −[δc+δ2]. In contraction mode therefore, the PZT assumes a slightly convex shape when viewed from the top, i.e. the PZT top surface assumes a slightly convex shape, which is in a bending direction that is the opposite from the bending of the prior art PZT of FIG. 4. That bending according to the invention therefore adds to the effective stroke length rather than subtracting from it.

Figure 4A:
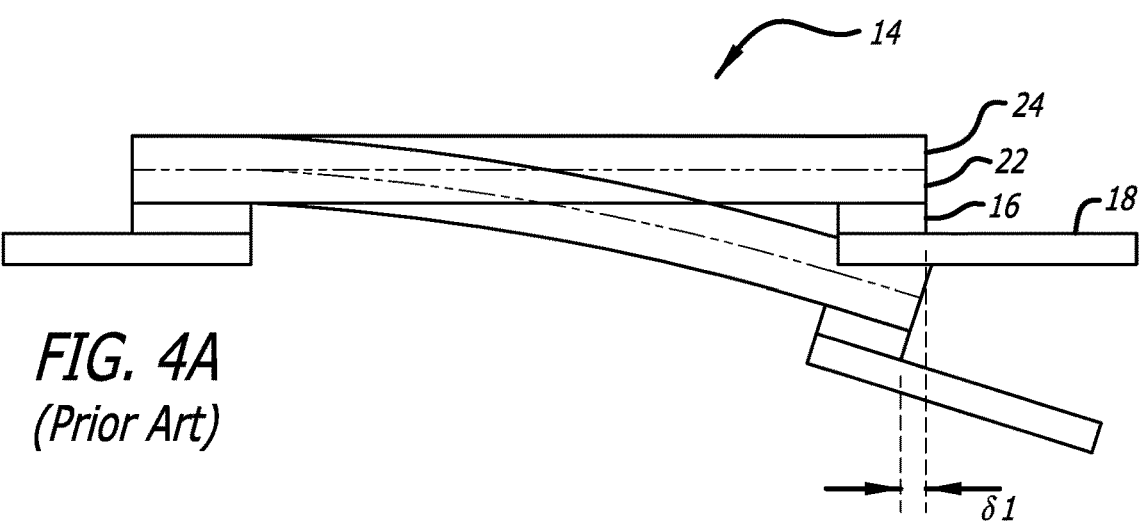
FIG. 4A is a side sectional view of a PZT microactuator mounted in a suspension according to prior art FIG. 2 when a voltage is applied to the PZT so as to expand it.
Figure 4B:
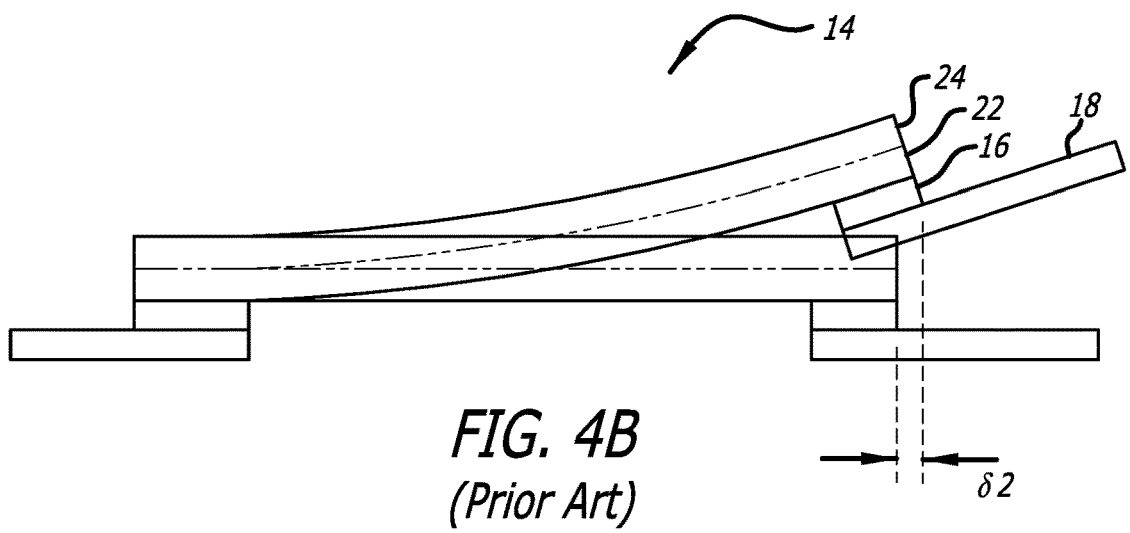
FIG. 4B is a side sectional view of a PZT microactuator mounted in a suspension according to prior art FIG. 2 when a voltage is applied to the PZT so as to contract it.

Adding the constraining layer 130 to a PZT microactuator 114 has no appreciate affect on the stroke length for the otherwise unrestrained and unbonded PZT 114. When that PZT 114 is bonded to a suspension 18 at its bottom ends such as shown in FIG. 4, however, the effect of the constraining layer is actually to slightly increase the stroke length. Stainless steel has a Young's modulus of around 190-210 GPa. Preferably the material for the constraining layer has a Young's modulus of greater than 50 GPa, and more preferably greater than 100 GPa, and more preferably still greater than 150 GPa.

Figure 9:
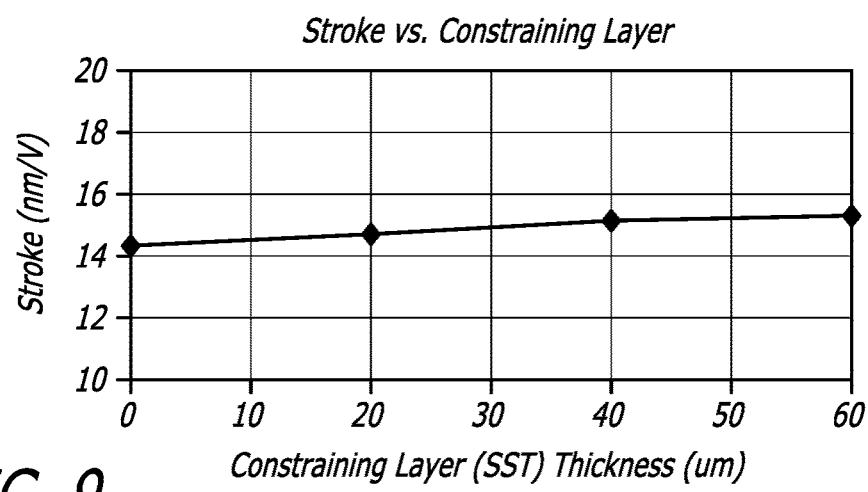
FIG. 9 is a graph showing stroke length per unit input voltage in units of nm/V verses constraining layer thickness, for a PZT that is 130 µm thick.

FIG. 9 is a graph of stroke length per unit input voltage in units of nm/V verses constraining layer thickness, for a PZT 114 that is 130 µm thick and has a constraining layer 130 of stainless steel bonded thereto, according to a simulation. Adding an SST restraining layer of 20 µm, 40 µm, and 60 µm thick onto the PZT top surface each result in an increased total stroke length. Adding a constraining layer therefore actually increased the total stroke length.

Figure 10:
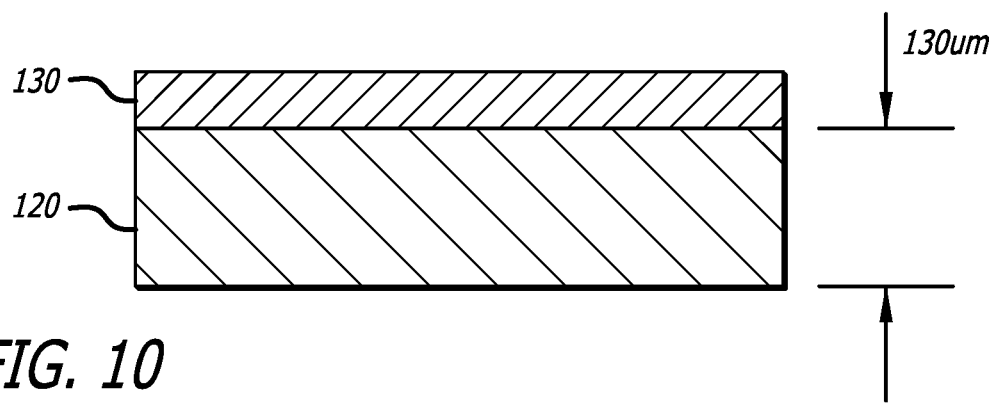
FIG. 10 is a side elevation view of a PZT having a constraining layer bonded thereto according to the invention.
Figure 11:
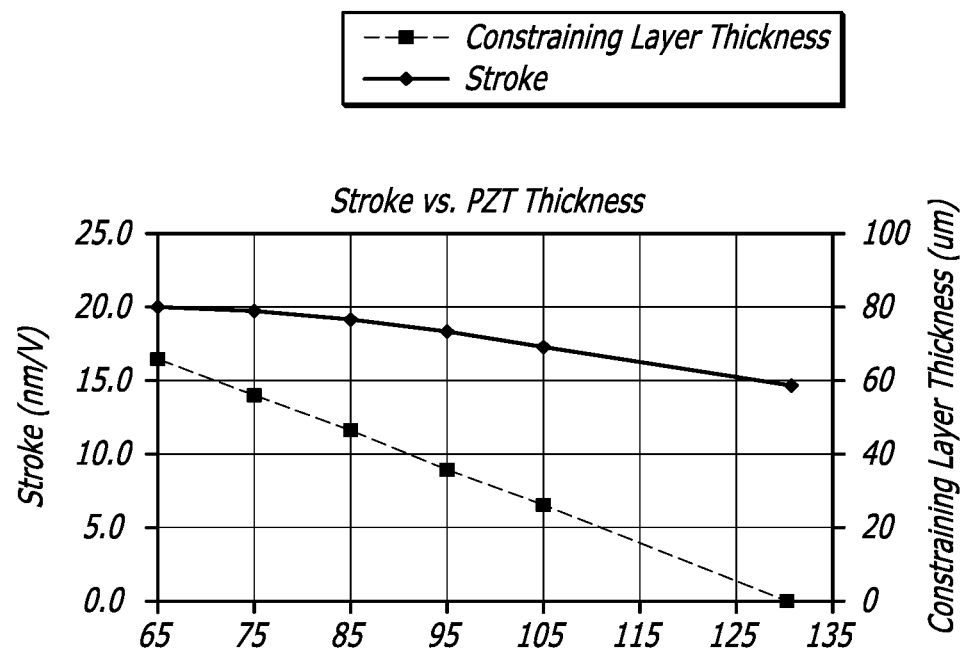
FIG. 11 is a graph of stroke length vs. PZT thickness for the PZT of FIG. 10 where the combined thickness of the PZT and the restraining layer is kept constant at 130 µm.

One could also hold constant the total combined thickness of the PZT and the constraining layer, and determine an optimal thickness for the constraining layer. FIG. 10 is a side elevation view of a combined PZT and constraining layer bonded thereto according to the invention, in which the total thickness is kept constant at 130 µm. FIG. 11 is a graph of stroke length vs. PZT thickness for the PZT of FIG. 10 where the combined thickness of the PZT and the restraining layer is kept constant at 130 µm according to a simulation. With no constraining layer, the 130 µm thick PZT has a stroke length of approximately 14.5 nm/V. With a constraining layer 130 thickness of 65 µm and a PZT thickness of 65 µm, the PZT has a stroke length of approximately 20 nm/V. Adding the constraining layer therefore actually increased the effective stroke length by approximately 35%.

Figure 12:
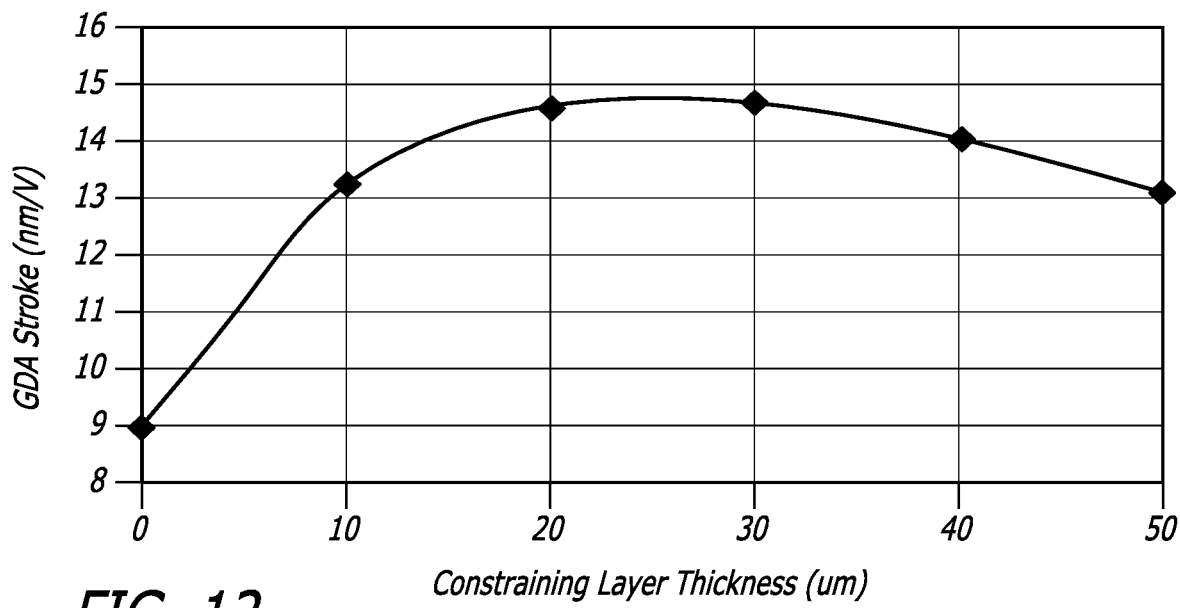
FIG. 12 is a graph of GDA stroke sensitivity versus constraining layer thickness for a suspension having a PZT with stainless steel constraining layers of varying thicknesses.

FIG. 12 is a graph of GDA stroke sensitivity versus constraining layer thickness for a GDA suspension having the microactuator of FIG. 7 for a PZT element that is 45 µm thick and a stainless steel constraining layer on top of varying thicknesses, according to a simulation. As seen in the graph, a constraining layer that is 30 µm thick increased the GDA stroke sensitivity from 9 nm/V to slightly more than 14.5 µm, which represents an increase in stroke length of greater than 50%.

Figure 13A:
FIGS. 13(a)-13(h) illustrate one manufacturing process by which a PZT having a constraining layer according to the invention can be produced.
Figure 13B:
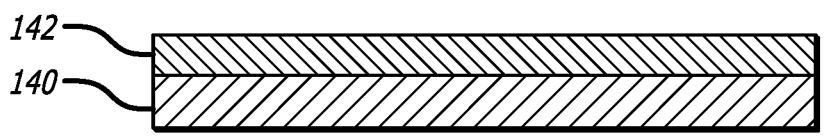
Figure 13C:
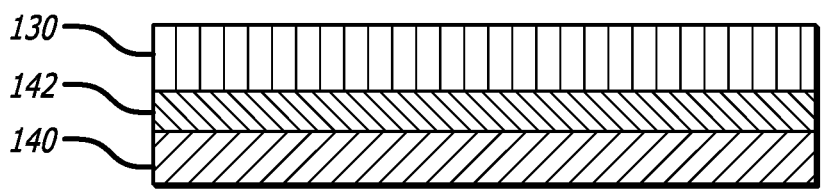
Figure 13D:
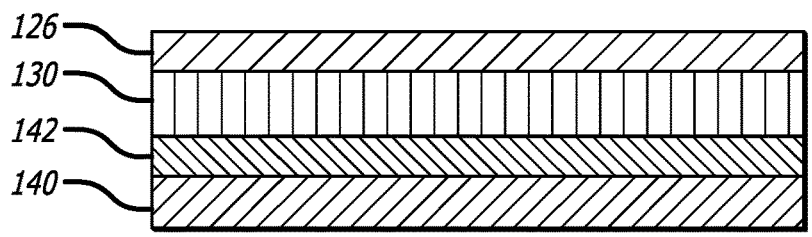
Figure 13E:
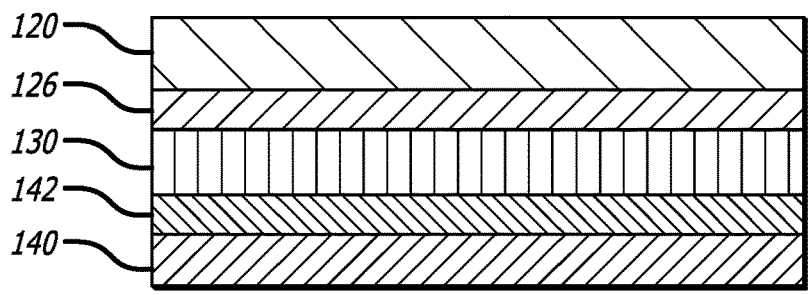
Figure 13F:
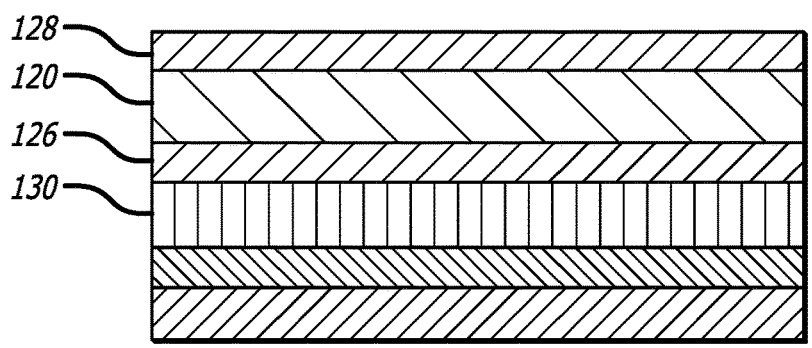
Figure 13G:
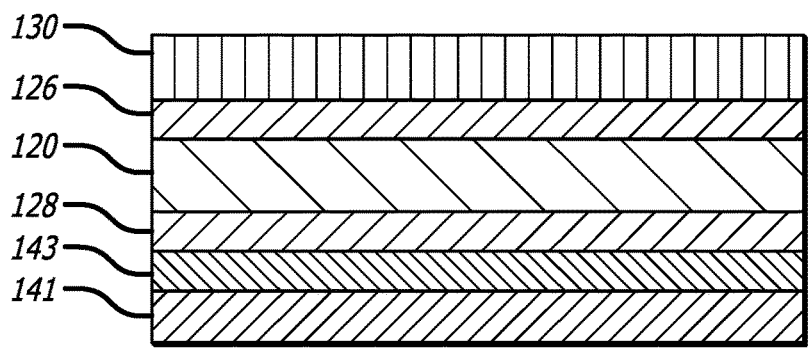
Figure 13H:
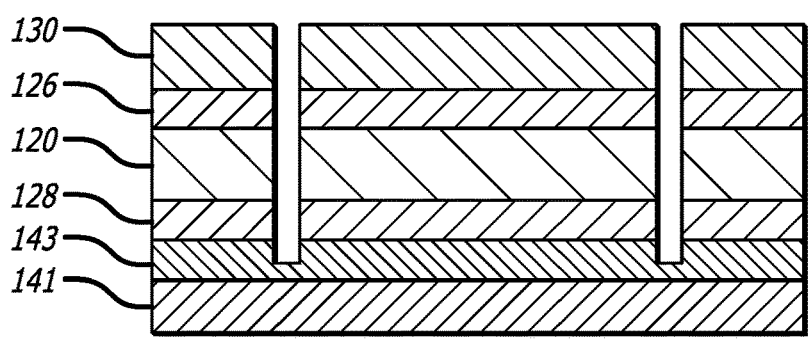

FIGS. 13(a)-13(h) illustrate one manufacturing process by which a PZT microactuator assembly having a constraining layer according to the invention can be produced. This method is an example of an additive method in which the PZT material is deposited onto a substrate that will be the constraint layer. The process begins with a first substrate 140 as shown in FIG. 13(a). In FIG. 13(b) a first UV/thermal tape 142 is applied to the substrate. In FIG. 13(c) a pre-formed SST layer 130 is added onto the tape. In FIG. 13(d) an electrode layer 126 is deposited onto the SST such as by sputtering or other well known deposition processes. In FIG. 13(e) a PZT layer 120 is formed on the electrode layer by the sol-gel method or other known methods. In FIG. 13(f) a second electrode 128 is deposited onto the exposed side of the PZT such as by sputtering. In FIG. 13(g) the SST layer 130 is separated from the tape, and the product is flipped over onto a second tape 143 and a second substrate 141. In FIG. 13(h) the product is then diced such as by mechanical sawing or laser cutting in order to singulate the individual microactuators 114. This process produces a microactuator 114 in which the PZT element 120 including its electrodes is bonded directly to the SST restraining layer 130 without any other material, such as an organic material such as polyimide that would render the restraining effect of the restraining layer less effective, therebetween. The electrode layers may be of materials such as Au, Ni, Cr, and/or Cu. Au has a Young's modulus of about 79 GPA, Cu has a Young's modulus of about 117 GPa, Ni has a Young's modulus of about 200, and Cr has a Young's modulus of about 278. Preferably, there is no intermediary layer between the SST restraining layer 130 and the PZT element 120 that has a Young's modulus that is less than 20 GPa, or which has a Young's modulus that is substantially less than the Young's modulus of the restraining layer, or a Young's modulus that is less than half the Young's modulus of the restraining layer.

Although other methods could be used to produce the product such as by bonding the restraining layer directly to the PZT surface by adhesive such as epoxy, the method shown in FIGS. 13(a)-13(g) is currently anticipated to be the preferred method.

The SST restraining layer 130 acts as a substrate for the PZT layer 120 both during the additive manufacturing process as well as in the finished product. The restraining layer 130 is therefore sometimes referred to as a substrate.

Figure 14A:
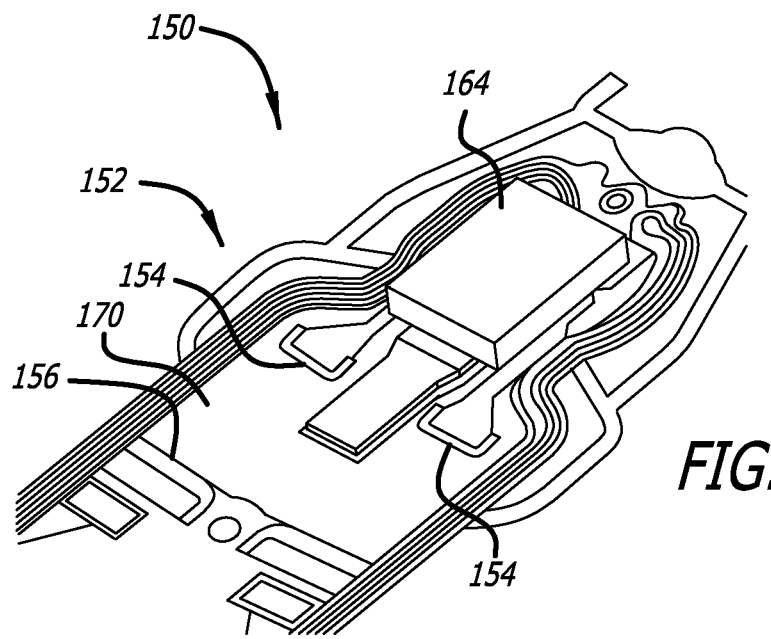
FIGS. 14(a) and 14(b) are oblique views of a GSA suspension being assembled with thin film PZT microactuator motors according to the invention.
Figure 14B:
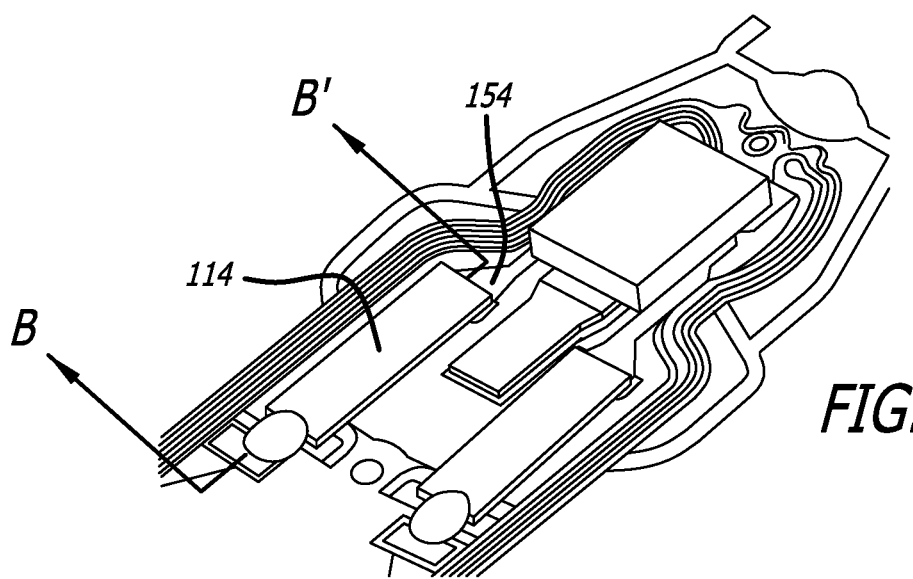

FIGS. 14(a) and 14(b) are oblique views of a gimbal mounted dual stage actuated (GSA) suspension 150 being assembled with thin film PZT microactuator motors 114 according to the invention. In a GSA suspension the PZTs are mounted on the trace gimbal which includes a gimbal assembly, and act directly on the gimbaled area of the suspension that holds the read/write head slider 164. FIG. 14(a) shows the suspension 150 before PZT microactuator assemblies 114 are attached. Each of two microactuators 114 will be bonded to, and will span the gap 170 between, tongue 154 to which the distal end of microactuator 114 will be bonded, and portion 156 of the trace gimbal to which a proximal end of microactuator 114 will be bonded. FIG. 14(b) shows the suspension 150 after PZT microactuators 114 are attached. When microactuator assembly 114 is activated, it expands or contracts and thus changes the length of the gap 170 between the tongue 154 and portion 156 of the trace gimbal, thus effecting fine positioning movements of head slider 164 which carries the read/write transducer.

Figure 15:
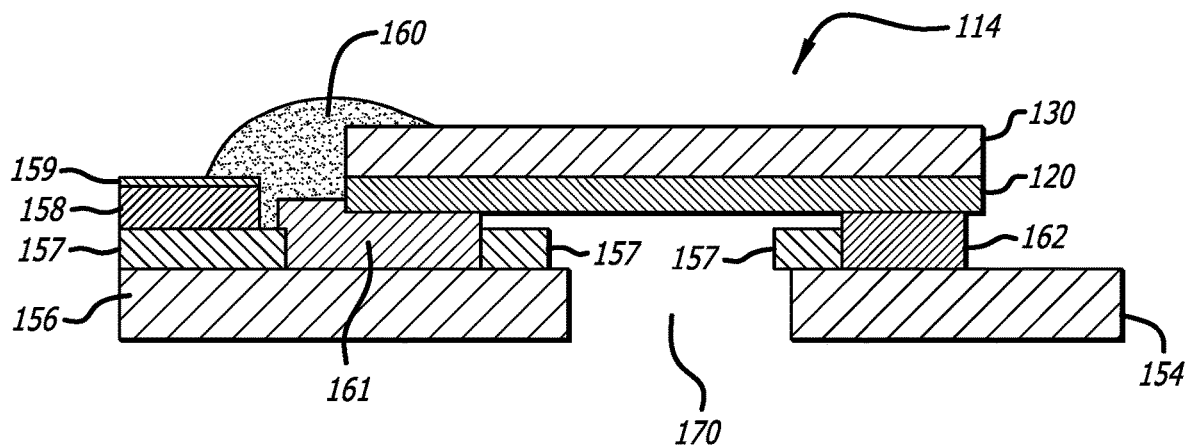
FIG. 15 is cross-sectional view of the microactuator area of FIG. 14(b) taken along section line B-B'.

FIG. 15 is cross-sectional view of FIG. 14(b) taken along section line B-B'. GSA suspension 150 includes a trace gimbal 152, which includes layers of stainless steel, an insulator 157 such as polyimide, and a layer of signal conducting traces 158 such as Cu covered by a protective metal 159 such as Au or a combination of Ni/Au. Microactuators 114 are attached at their distal ends to stainless steel tongues 154 extending from the gimbal area by conductive adhesive 162 such as epoxy containing Ag particles to make it electrically conductive, and at their proximal ends to a mounting area 156 of the stainless steel by non-conductive adhesive 161 such as non-conductive epoxy. The driving voltage electrical connection is made by a spot of conductive adhesive 160 that extends from the gold plated copper contact pad 158 to the top surface of PZT microactuator 114, and more particularly in this case to the SST layer 130 which constitutes the top electrode of the microactuator.

Figure 16:
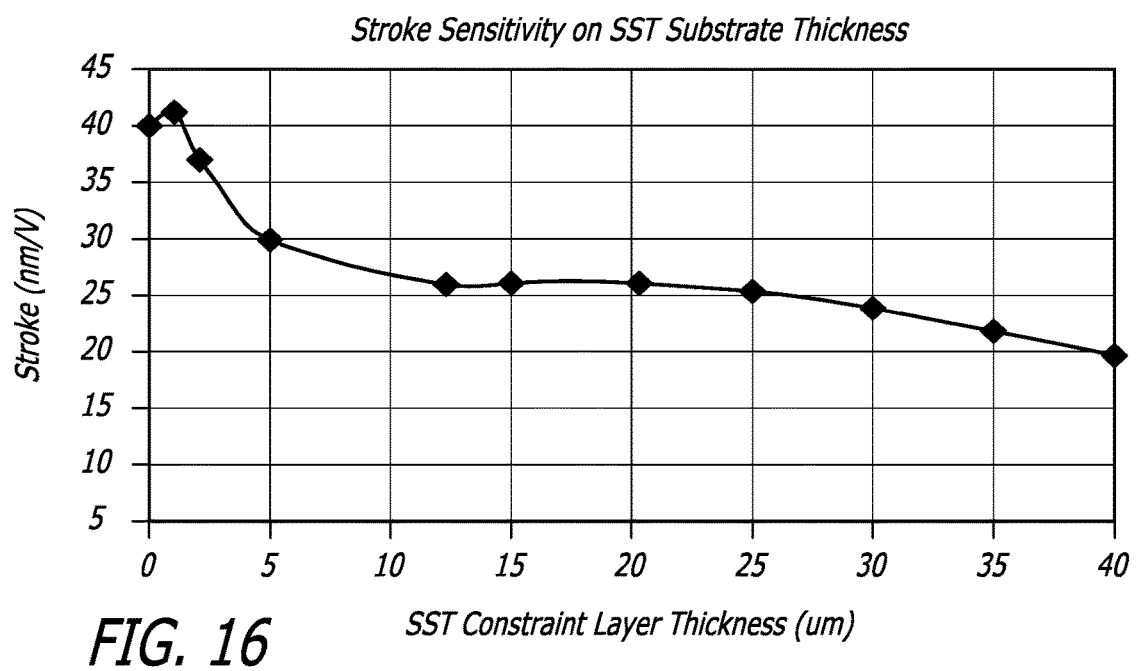
FIG. 16 is a graph of stroke sensitivity versus SST substrate thickness for the microactuator of FIG. 15 according to a simulation.

The SST substrate thickness may be varied to some degree without compromising the benefits of the disclosed thin film PZT structure. FIG. 16 is a graph of stroke sensitivity versus SST constraining layer thickness for the microactuator of FIG. 15 according to a simulation. A thin film PZT having a 40 µm thick SST constraining layer exhibited a stroke sensitivity of 20 nm/V according to a simulation, which is almost 3 times the stroke sensitivity of the aforementioned 45 µm thick bulk PZT. A 45 µm thick SST constraining layer, however, would provide better protection to the thin film PZT microactuator.

Figure 17A:
FIGS. 17(a)-17(f) illustrates a process for manufacturing a thin film PZT structure having a stainless steel substrate according to the invention.
Figure 17B:
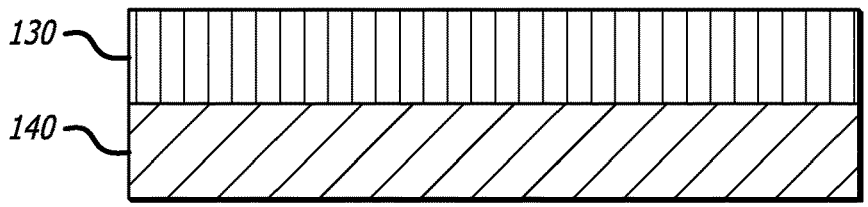
Figure 17C:
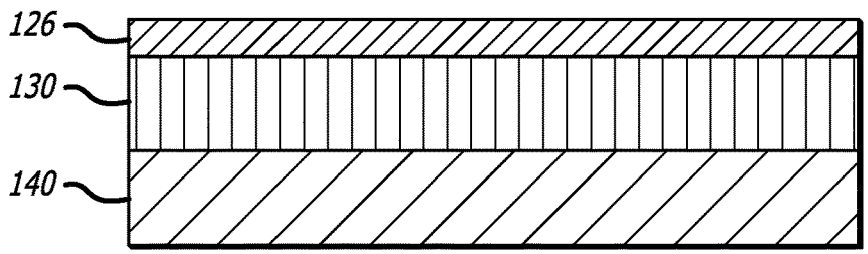
Figure 17D:
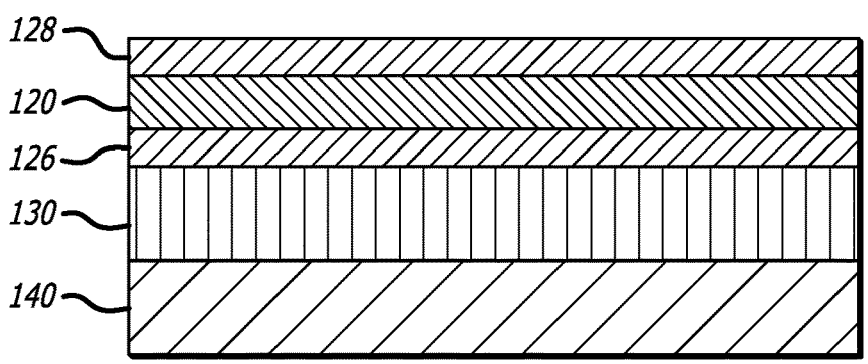
Figure 17E:
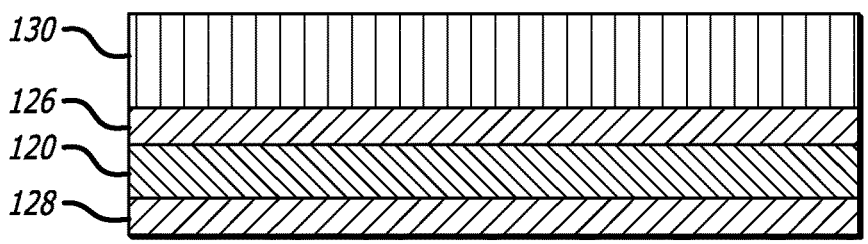
Figure 17F:
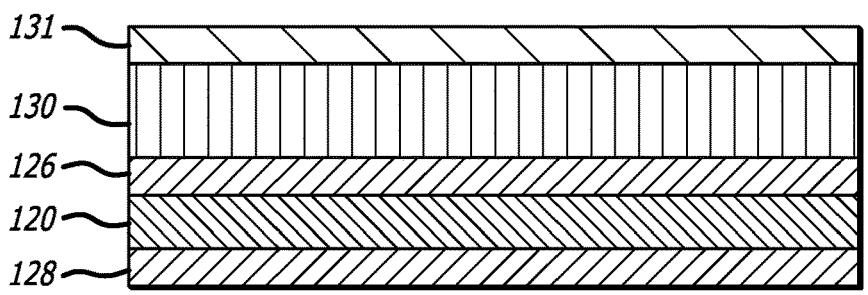

FIGS. 17(a)-17(f) illustrates an alternative process for manufacturing a thin film PZT structure having an SST constraining layer according to the invention. In FIG. 17(a) the process begins with a silicon substrate 144 instead of a substrate 140 and tape 142 as in FIG. 18(b). In FIG. 17(b) an SST layer (130) is bonded to the silicon. The process otherwise proceeds in essentially the same way as the process of FIGS. 13(c)-13(h), including the flipping of the assembly over and removal of the silicon substrate in FIG. 17(e). Additionally, these figures explicitly show the addition of final NiCr/Au layer 131, which was not explicitly shown in FIG. 13(e).

Figure 18:
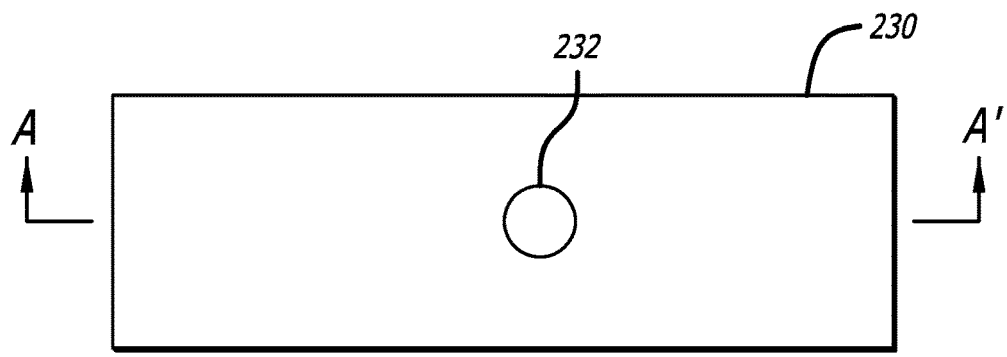
FIG. 18 is a top plan view of a thin film PZT structure having a silicon substrate according to the invention.
Figure 19:
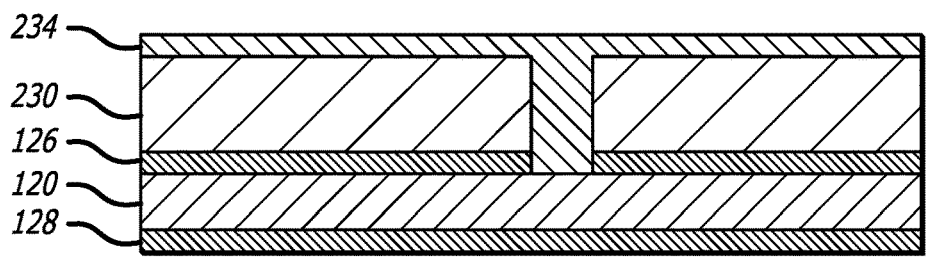
FIG. 19 is a side sectional view of the thin film PZT structure of FIG. 18 taken along section line A-A'.

As mentioned above, different types of constraint layers may be used in different implementations. Other rigid materials, either conductive or non-conductive, can also be used as the constraint layer or substrate. Silicon, for example, could be used as the constraint layer material. FIG. 18 is a top plan view of a thin film PZT structure having a silicon constraint layer according to an embodiment of the invention. FIG. 19 a cross sectional view of the microactuator of FIG. 18 taken along section line A-A'. Because the silicon constraint layer 230 is non-conductive, a via 232 is provided in order to conduct the PZT driving voltage from a conductive top layer 234 such as Au over silicon 230 through to the metalized electrode 126 on the PZT element 120. The via may be formed and filled with conductive metal as disclosed in U.S. Pat. No. 7,781,679 issued to Schreiber et al. which is owned by the assignee of the present invention and which is incorporated herein by reference for its teachings of conductive vias and methods of forming conductive vias.

Figure 20:
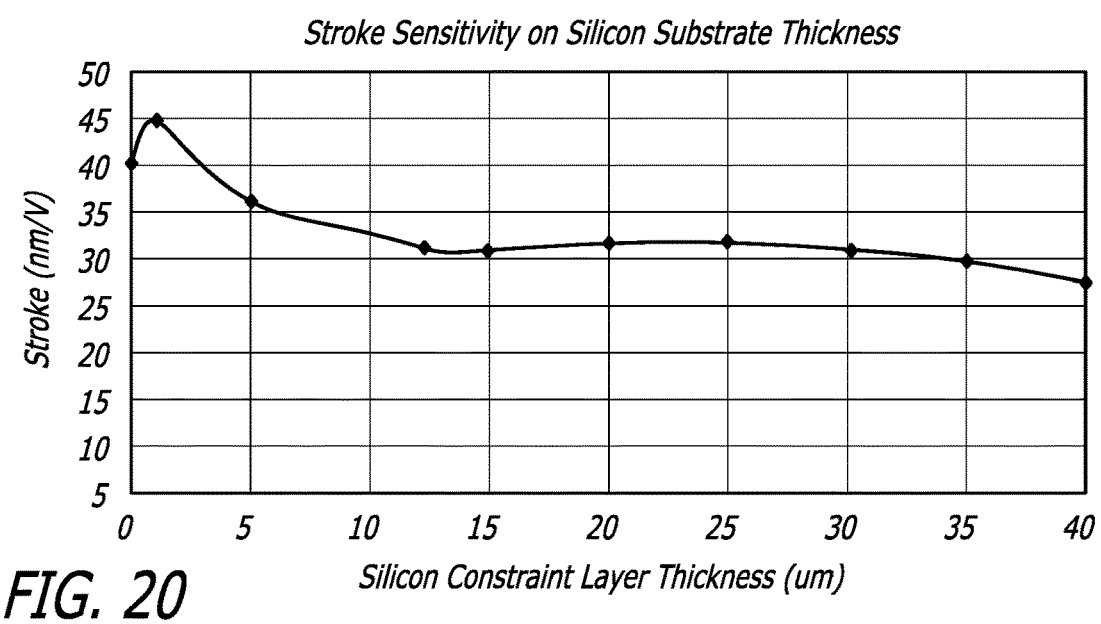
FIG. 20 is a graph of stroke sensitivity versus silicon substrate thickness for the microactuator of FIG. 19 according to a simulation.
Figure 21A:
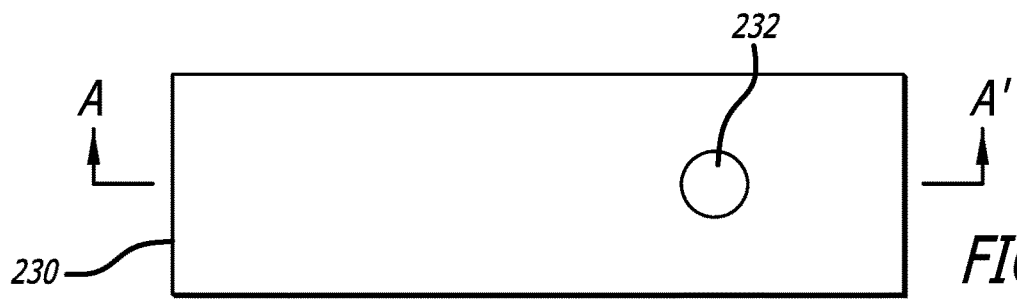
FIGS. 21(a)-21(e) illustrate a process for manufacturing the thin film PZT structure of FIG. 18.
Figure 21B:
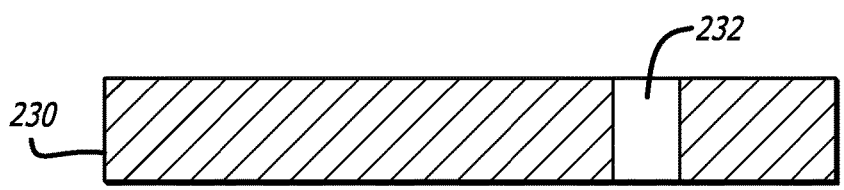
Figure 21C:
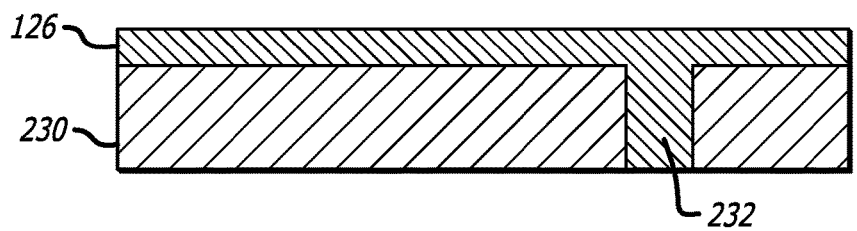
Figure 21D:
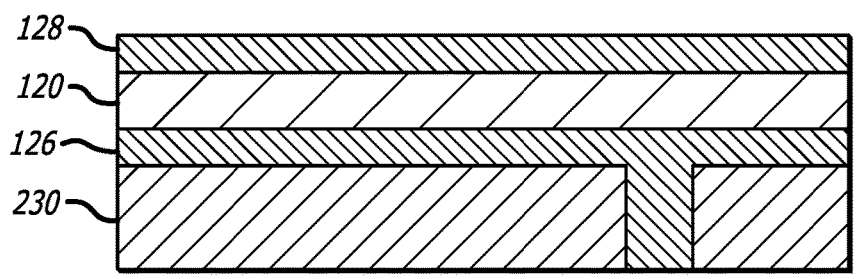
Figure 21E:
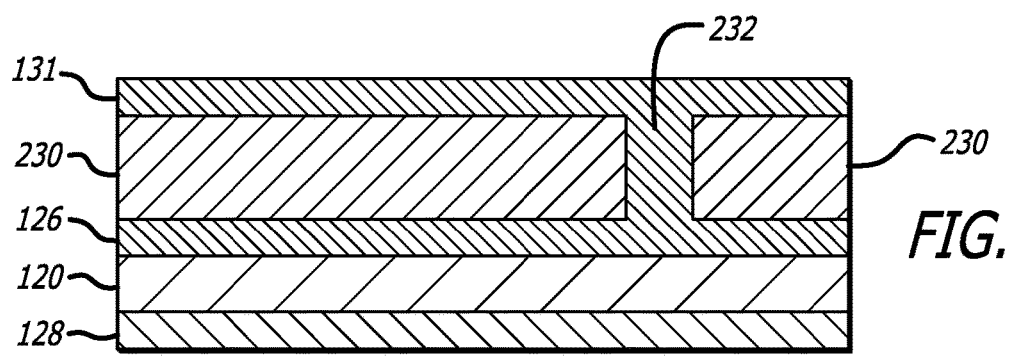

FIG. 20 is a graph of stroke sensitivity versus silicon substrate thickness for the microactuator of FIG. 19 according to a simulation. As shown in the graph, a thin film PZT having a thickness of 3 µm and a 20 µm thick silicon substrate may exhibit a stroke sensitivity of 31.5 nm/V. This is more than 4 times as high as the stroke sensitivity of a design with a 45 µm thick bulk PZT. The silicon substrate also helps to improve the reliability of the thin film PZT.

Figure 22:
FIG. 22 is a top plan view of a thin film PZT having a substrate and having side vias according to an embodiment of the invention.

FIGS. 21(*a*)-21(*e*) illustrate a process for manufacturing the thin film PZT structure of FIG. 18. The process begins in FIGS. 21(*a*) and 21(*b*) with a silicon substrate having a hole or via 232 that has been formed in it such as by laser drilling. In FIG. 21(*c*) the NiCr/Au layer is added to silicon substrate 230 to form top electrode 126. The NiCr/Au also fills the hole to make it an electrical via 232. More generally, other conductive material may be used to fill the via. In FIG. 22(*d*) a PZT thin film 120 is deposited such as by the sol-gel method, and another layer of NiCr/Au is added to form the bottom electrode 128. In FIG. 22(*e*) the material is flipped over, and a final NiCr/Au layer 131 is added. Layers 131 and 126 are electrically connected by via 232 so that a voltage (or ground potential) applied to the conductive gold layer 131 will be transmitted to the PZT element 126. This manufacturing process for a thin film PZT microactuator having a silicon substrate may be less complicated than the manufacturing process for the thin film PZT having an SST substrate.

Figure 23:
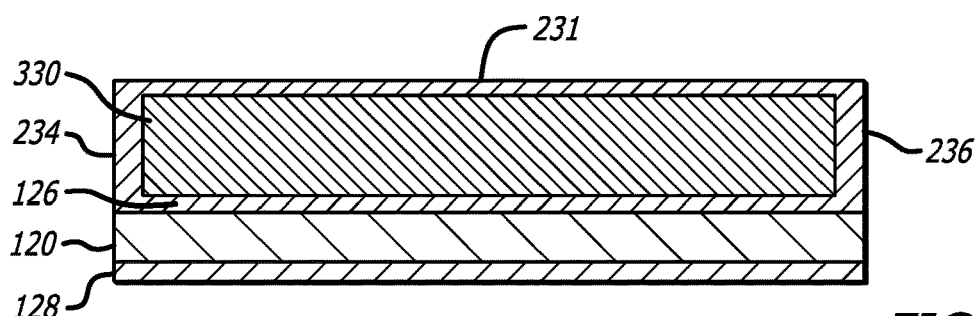
FIG. 23 is a sectional view of the microactuator of FIG. 22 taken along section line A-A'.

In an alternative embodiment, the middle via on the silicon substrate can be replaced by one or more vias at the end the silicon. Therefore, after the final dicing, a half-circle will be formed at each end of the silicon. FIG. 22 is a top plan view of a thin film PZT microactuator having a silicon or other non-conductive constraining layer 330 with conductive top layer 231 such as a metallization layer thereon, and having side vias 234, 236 that electrically connect top layer 231 to top electrode 126. FIG. 23 is a sectional view of the PZT of FIG. 22 taken along section line A-A'. The manufacturing process for this embodiment can be otherwise identical with that of FIGS. 21(*a*)-21(*e*).

Figure 24:
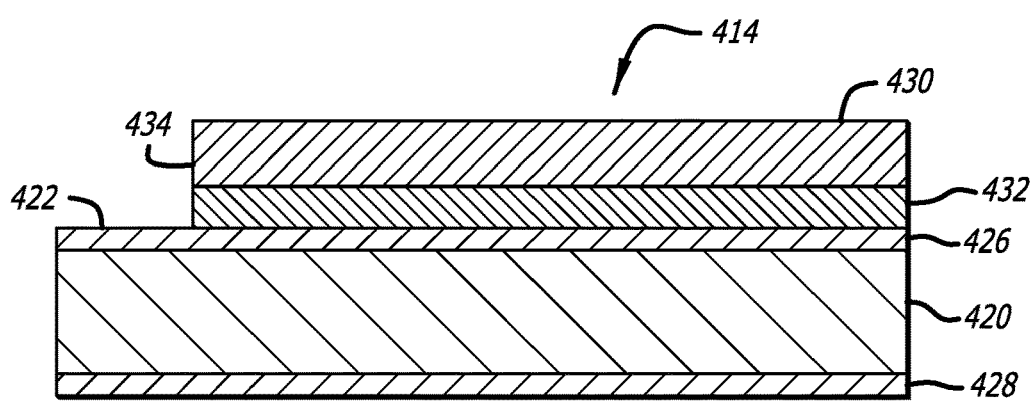
FIG. 24 is a sectional view of a PZT microactuator according to an additional embodiment of the invention.

The constraining layer may be larger (of greater surface area) than the PZT element, the same size as the PZT element, or may be smaller (of lesser surface area) than the PZT element. FIG. 24 is a side sectional view of a PZT microactuator assembly 414 in which the constraint layer 430 is smaller than the PZT element 420, giving the microactuator a step-like structure having a step 434 and an exposed shelf 422 that is uncovered by the restraining layer 430, and with the shelf 422 being where the electrical connection is made to the PZT element 420. One benefit of such a construction including a step where the electrical connection is made is that the completed assembly including the electrical connection has a lower profile than if the restraining layer 430 covers the entire PZT 420. A lower profile is advantageous because it means that more hard drive platters and their suspensions can be stacked together within a given platter stack height, thus increasing the data storage capacity within a given volume of disk drive assembly. It is anticipated that the constraint layer 430 would cover more than 50% but less than 95% of the top surface of PZT element 420 in order to accommodate the electrical connection on shelf 422.

Simulations have shown that microactuators constructed according to the invention exhibit enhanced stroke sensitivity, and also exhibited reduced sway mode gain and torsion mode gain. These are advantageous in increasing head positioning control loop bandwidth, which translates into both lower data seek times and lower susceptibility to vibrations.

Figure 25:
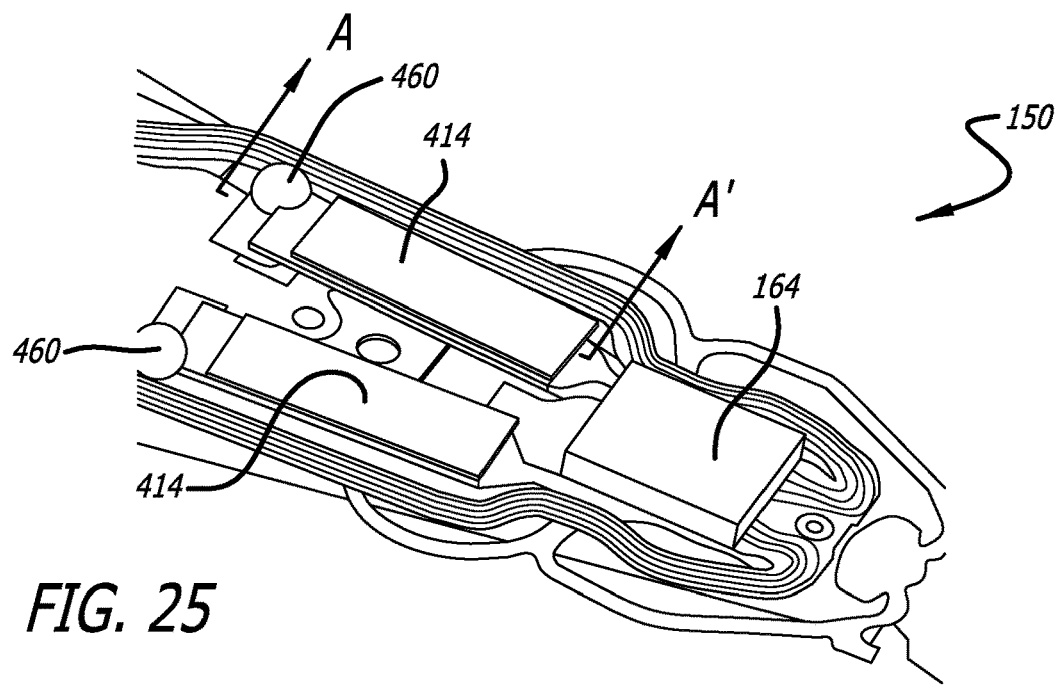
FIG. 25 is an oblique view of a GSA suspension having a pair of the PZT microactuators of FIG. 24.

FIG. 25 is an oblique view of a GSA suspension having a pair of the PZT microactuators 414 of FIG. 24.

Figure 26:
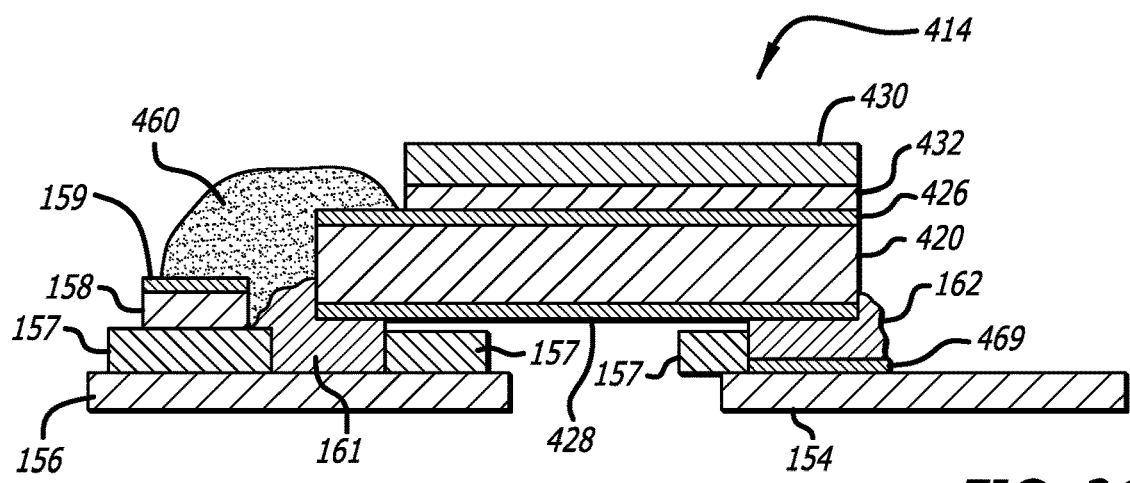
FIG. 26 is a sectional view of the GSA suspension of FIG. 25 taken along section line A-A'.

FIG. 26 is a sectional view of the GSA suspension of FIG. 25 taken along section line A-A'. In this embodiment conductive adhesive 460 such as conductive epoxy does not extend over the restraint layer 430. Rather, conductive epoxy 460 extends onto shelf 422 on top of PZT element 420 and establishes electrical connection to the PZT 420 and to the overall microactuator assembly 414 by that surface. As depicted, the electrical connection defined by conductive epoxy 460 has an uppermost extent that is lower than the top surface of the SST restraint layer 430. More generally, regardless of whether the electrical connection is made by conductive adhesive, a wire that is bonded such as by thermosonic bonding, soldering, or other techniques, the electrical connection 461 to the microactuator assembly 414 can be made to be no higher than, or even lower than, the uppermost extent of microactuator 414. This allows the microactuator assembly 414 including its electrical connection to be as thin as possible, which in turn allows for a denser stack of data storage disk platters within the platter stack of a disk drive assembly.

The figure also explicitly shows gold layer 469 over the stainless steel portion 154 of the trace gimbal to which microactuator 414 is mounted. Gold layer 469 provides corrosion resistance and enhanced conductivity to the SST.

In this embodiment as with all of the other embodiments, the restraining layer and more generally the top surface of the PZT microactuator assembly, will normally have nothing bonded to it other than an electrical connection.

Figure 27:
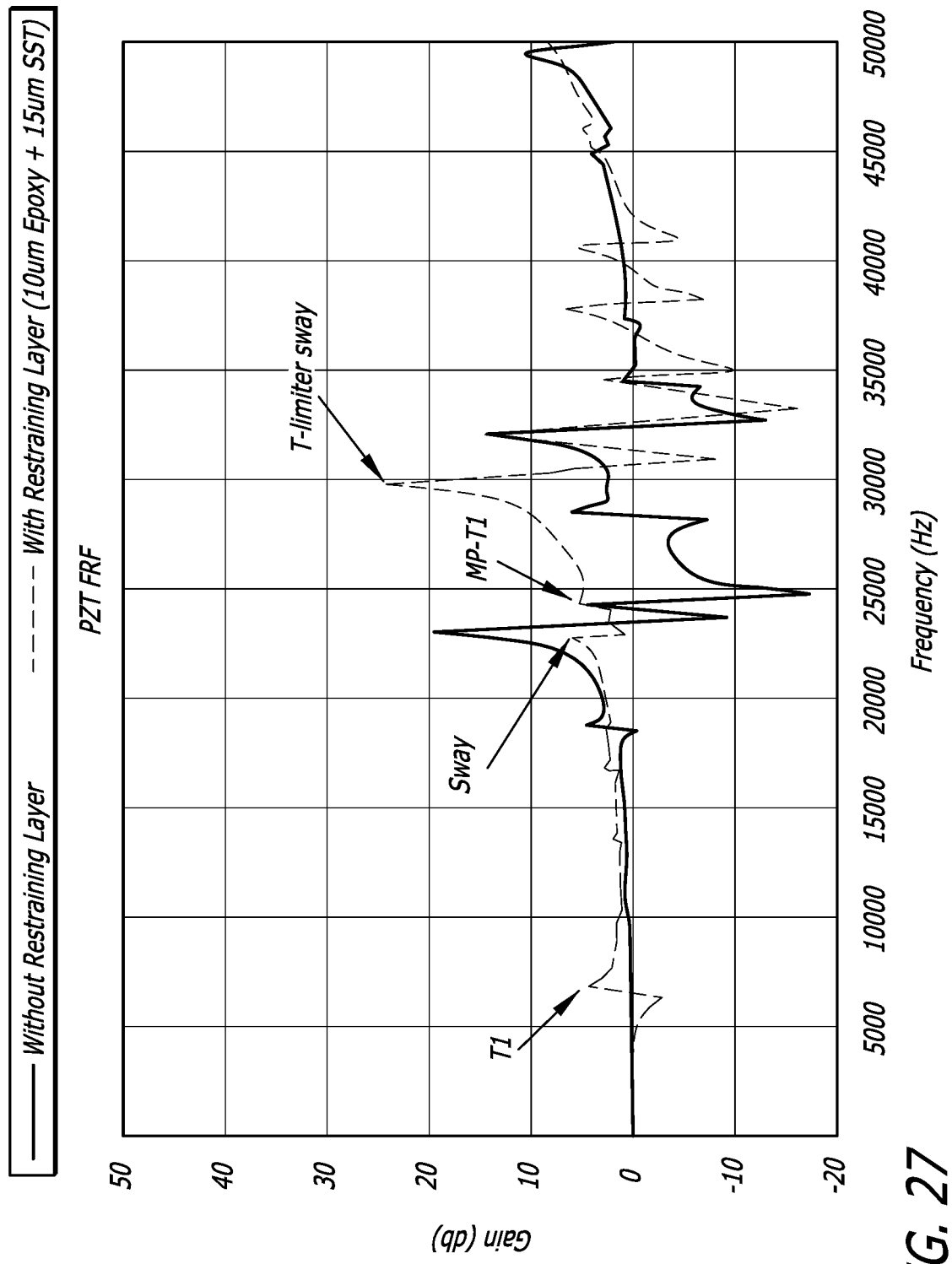
FIG. 27 is a graph of the PZT frequency response function of the suspension of FIG. 25 according to a simulation.
Figure 28A:
FIGS. 28(a)-28(j) illustrate an exemplary process for manufacturing the PZT microactuator assembly of FIG. 24.
Figure 28B:
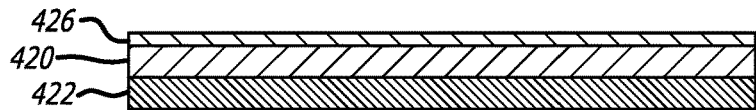
Figure 28C:
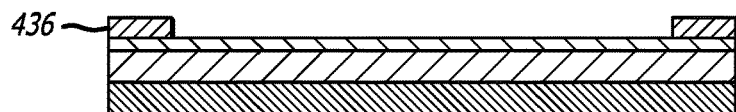
Figure 28D:
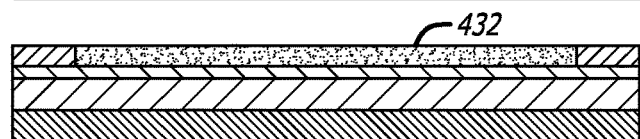
Figure 28E:
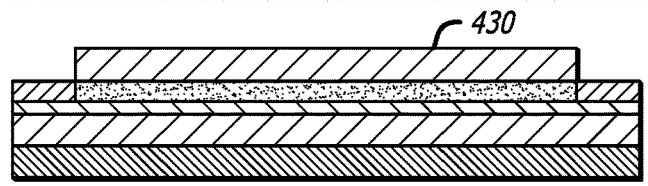
Figure 28F:
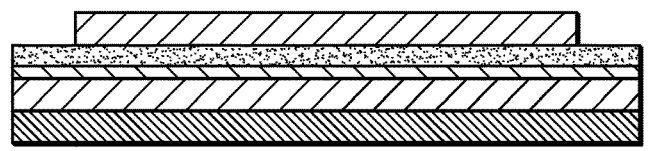
Figure 28G:
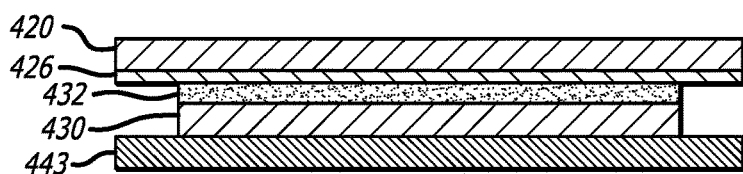
Figure 28H:
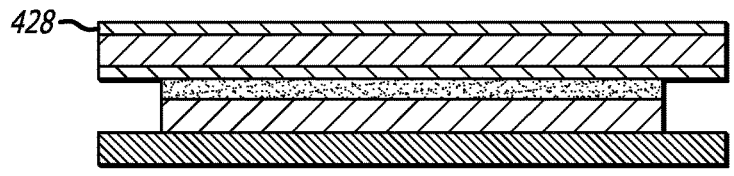
Figure 28I:
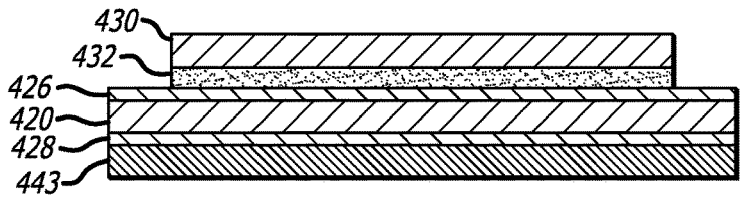
Figure 28J:
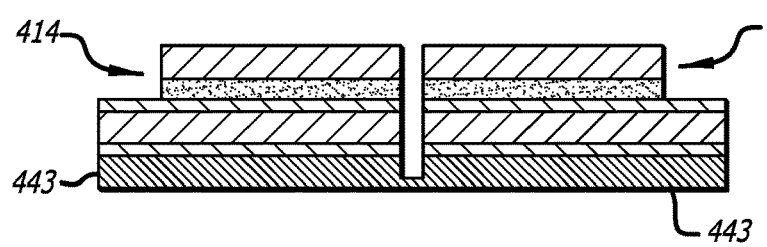

FIG. 27 is a graph of the frequency response of the PZT frequency response function of the suspension of FIG. 26, according to a simulation. The suspension exhibited reduced sway mode gain and torsion mode gain as compared to a simulation without the constraint layer 430. These are advantageous in increasing head positioning control loop bandwidth, which translates into both lower data seek times and lower susceptibility to vibrations.

FIGS. 28(*a*)-28(*j*) illustrate a process for manufacturing the thin film PZT assembly 114 of FIG. 24. In FIG. 28(*a*) a bulk PZT wafer 420 is placed onto a transfer tape 422. In FIG. 28(*b*) the top electrode layer 426 is formed such as by sputtering and/or electrodeposition. In FIG. 28(*c*) a mask 436 is placed over parts of top electrode 426. In FIG. 28(*d*) conductive epoxy 432 is applied. In FIG. 28(*e*) a stainless steel layer that will be constraint layer 430 is applied to the epoxy, which is then cured. In FIG. 27(*f*) the mask 436 is removed. In FIG. 27(*g*) the assembly is flipped over and placed down onto a second transfer tape 443. In FIG. 27(*h*) the bottom electrode layer 428 is formed such as by sputtering and/or electrodeposition. The PZT element 420 is then polarized. In FIG. 27(*i*) the assembly is then flipped over once more to a third transfer tape 444. IN FIG. 28(*j*) then assembly is singulated by cutting, to produce finished PZT microactuator assemblies 414.

Figure 29:
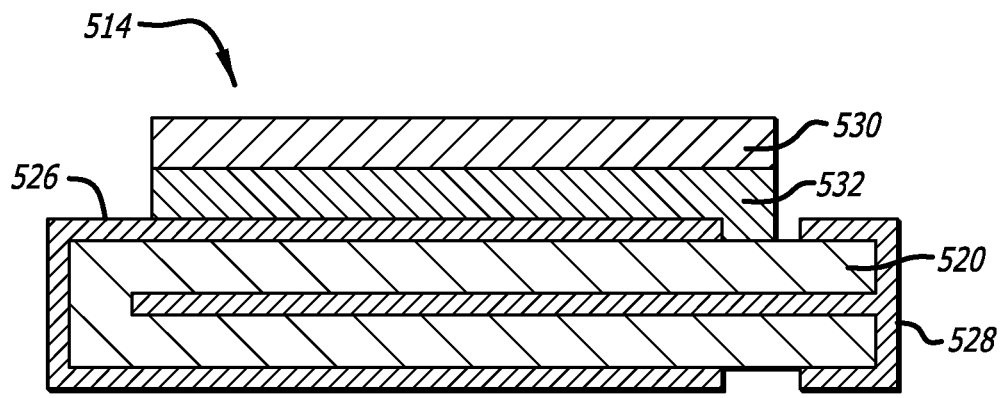
FIG. 29 is a side sectional view of a multi-layer PZT microactuator assembly according to an additional embodiment of the invention in which the PZT is a multi-layer PZT.

FIG. 29 is a side sectional view of a multi-layer PZT assembly 514 according to an additional embodiment of the invention. The assembly includes multi-layer PZT element 520, a first electrode 526 that wraps around the device, and a second electrode 528, and a constraint layer 530 that is bonded to the PZT element 520 by conductive epoxy 532. The figure shows a 2-layer PZT device. More generally, the device could be an n-layer PZT device.

Figure 30:
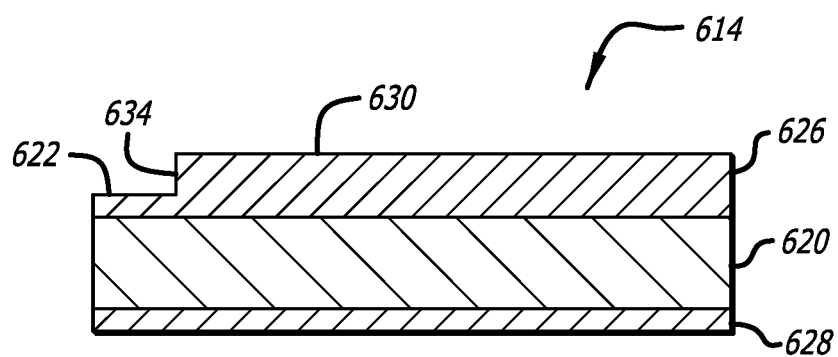
FIG. 30 is a side sectional view of a multi-layer PZT microactuator assembly according to an additional embodiment of the invention in which an extra thick electrode acts as the restraint layer.

FIG. 30 is a side sectional view of a multi-layer PZT microactuator assembly 614 according to an additional embodiment of the invention in which an extra thick electrode acts as the restraint layer. In this embodiment, PZT element 620 has a top electrode 626 and bottom electrode 628. Top electrode 626 includes a thinner first part 622 defining a shelf, and a thicker second part 630 which performs the majority of the restraining function. Step 634 lies at the transition from the thinner first part 622 to the thicker second part 630. Second electrode 626 could be applied to PZT element 620 by a deposition process including masking to create step 634, or by a deposition process with selective removal of material to create the step. Alternatively, second electrode 626 could be a piece of conductive material such as SST that is formed separately and then bonded to PZT element 620. Top electrode 626 could therefore be of the same material, or of a different material, than bottom electrode 628. Thicker second part 630 could be at least 50% thicker than thinner part 622 and/or second electrode 628, or thicker second party 630 could be at least twice as thick as thinner part 622 and/or second electrode 628. As with the embodiment of FIGS. 24-26, the electrical connection could be made to the shelf defined by thinner part 622, with the electrical connection not extending as high as, or higher than, the top surface of the thicker part 630 that defines the restraint layer.

The scope of the invention is not limited to the exact embodiments shown. Variations will be obvious to those skilled in the art after receiving the teachings herein. For example, the restraining layer need not be stainless steel, but can be some other relatively stiff and resilient material. The restraining layer need not be a single layer of one material, but could be composed of different layers of different materials. Although the restraining layer can cover the entire surface or substantially the entire top surface, the restraining could cover less than the entire surface, e.g., more than 90% of the top surface area, more than 75% of the top surface area, more than 50% of the top surface area, or even more than 25% of the top surface area. In embodiments having the step feature, the restraint layer is anticipated to cover less than 95% of the top surface of the microactuator. The constraining layer need not be a single integral layer, but could comprise multiple pieces such as a plurality of constraining strips arranged side by side on the top surface of the PZT, with the strips extending either in the direction of expansion/contraction or perpendicular to it. In one embodiment, the constraining layer could comprise two constraining pieces of stainless steel or other material bonded onto the top surface of the PZT, with the size and location of the two constraining pieces and their bonding generally mirroring the mounting area of two mounting shelves to which the PZT is bonded on its bottom surface. When the overall stiffness added by the restraining layer on the top of the device generally matches the overall stiffness added to the bottom of the device by being bonded to the suspension, and the bonded areas generally mirror each other, the net bending produced should be zero or close to zero. The result will be a PZT microactuator that, as mounted and deployed in a suspension, exhibits virtually no bending upon actuation.

In any and all of the embodiments discussed herein or suggested thereby, the constraining layer could be chosen so as to reduce the PZT bending that would otherwise occur during actuation, or it could be chosen so as to eliminate as much as possible any PZT bending, or it could be chosen so as to reverse the sign of the PZT bending. In applications in which the PZT(s) will be used as hard disk drive microactuator(s), it is envisioned that using a constraining layer to reverse the sign of the bending as shown and described in the illustrative examples above will be desirable in most cases because that increases the effective stroke length. In other applications for PZTs, however, it might not be desirable to reverse the sign. Thus, the invention can be used in general to control both the direction and the amount of the bending of a PZT, regardless of how the PZT is mounted or otherwise affixed to other components within any particular application. Depending on the application and the parameters chosen, the constraining layer can be used to decrease the PZT bending to less than 50% of what it otherwise would be, or to less than 25% of what it otherwise would be, or to reverse the sign of the bending. When the sign is reversed, a PZT that is bonded at or near its ends on its bottom surface and which has a restraining layer on top will bend such that its top surface assumes a concave shape when the PZT is in expansion or extension mode, rather than assuming a convex shape as would a similar PZT that does not have a restraining layer. Similarly, the PZT will assume a convex shape when the PZT is in contraction mode, rather than assuming a concave shape as would a similar PZT that does not have a restraining layer.

For various reasons, PZT elements are sometimes pre-stressed in an application such that when the PZT is not actuated by any voltage it is already bent in one direction or another, i.e., it is already either concave or convex. Of course, such pre-stressed PZTs could be used as microactuators in the present invention. In such a case, the PZT might not bend into a net or absolute concave shape or a net or absolute convex shape. For example, if the PZT is pre-stressed so that it already has a concave shape, upon activation with a positive activation voltage the device might bend into a more concave shape, and upon activation with a negative activation voltage the device might bend into a less concave shape which might be a nominally flat shape or it might be a convex shape. Unless specifically delineated therefore, the terms "concave" and "convex" should be understood in relative terms rather than in absolute terms.

Figure 31:
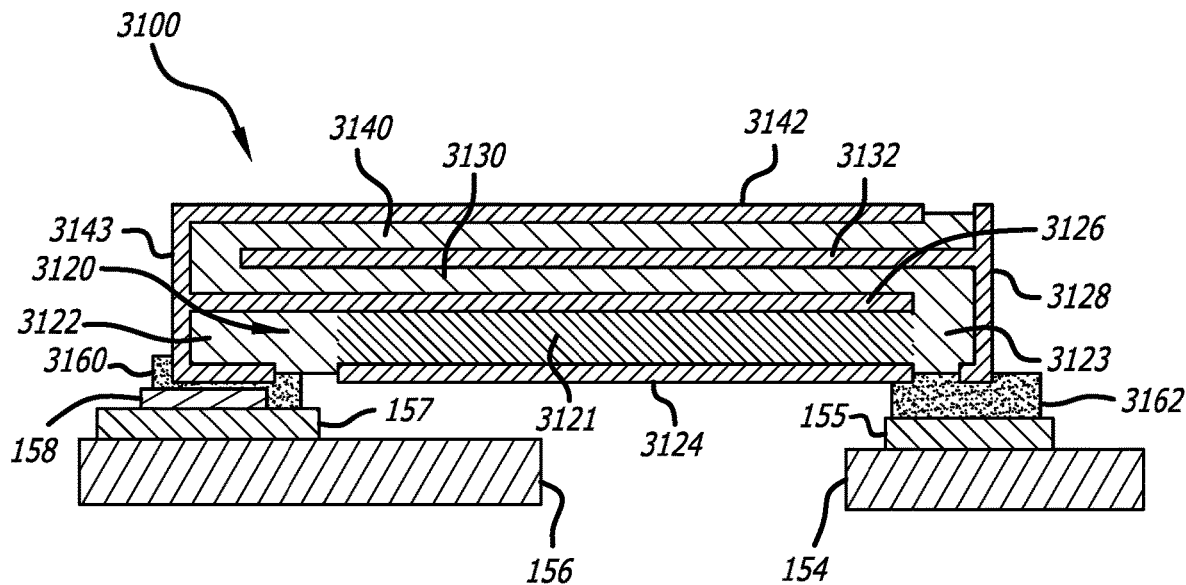
FIG. 31 is a cross sectional view of an embodiment in which the restraining layer of the microactuator assembly comprises one or more active PZT layers tending to act in the opposite direction as the main active PZT layer.

FIG. 31 is a cross sectional view of an embodiment of a multi-layer microactuator PZT assembly 3100 in which the restraining layer(s) of the microactuator assembly comprises one or more active PZT layers 3130, 3140 tending to act in the opposite direction as the main active PZT layer 3120 which is adjacent the surface of the suspension to which the microactuator 3100 is bonded. The PZT restraining layers 3130, 3140 thus constrain and actively oppose the action of main PZT layer 3120, and thus can be referred to as "constraining layers" or "opposing layers."

The PZT layers 3120, 3130, and 3140 are arranged in stacked planar relationships to one another. The main PZT layer 3120 comprises active PZT area 3121 which was subject to an electric field during poling and hence was poled, and which is subject to an electric field during device activation and hence will expand or contract, and also includes inactive PZT areas 3122 and 3123 which are not subjected to significant electric fields during either poling or activation and hence are not significantly piezoelectrically active. The device includes: a first or bottom electrode 3124; a second and top electrode 3126 for the active PZT area; a third electrode 3132 including end 3128 such that electrode 3132 both extends between the first active constraining layer 3130 and the second active constraining layer 3140 and wraps around the end of the PZT; and fourth electrode 3142 on top of the second active constraining layer 3140 including wrap-around portion 3143 which wraps around both the side and the bottom of the device. The device may be bonded to the suspension using conductive adhesive such as conductive epoxy 3160 mechanically and electrically bonding electrode 3142 to drive voltage electrical contact pad 158 which provides the microactuator driving voltage, and using conductive epoxy 3162 which mechanically and electrically bonds electrodes 3124 and 3128 of the device to grounded part 154 of the suspension.

Figure 32:
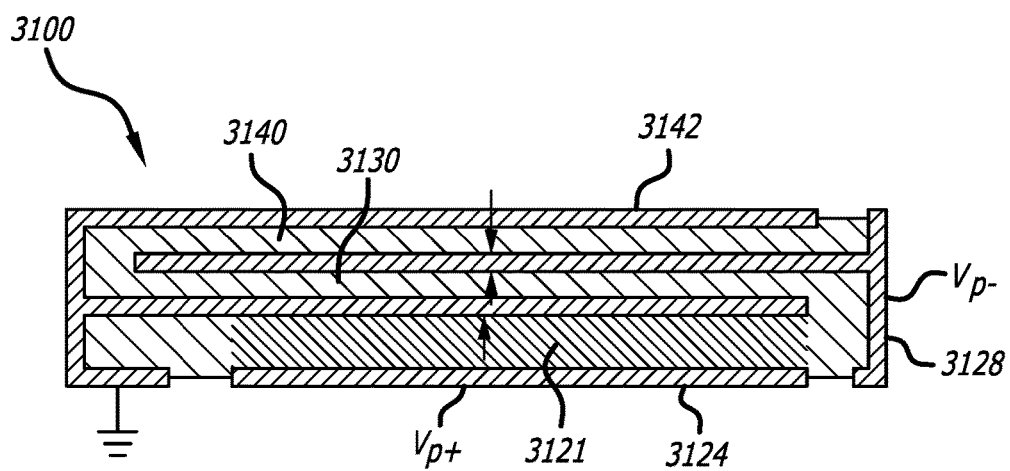
FIG. 32 shows the poling of the microactuator assembly of FIG. 31, including the resulting poling directions of the various layers of active PZT material.

To understand the operation of the device, one must understand how the device has been poled. FIG. 32 shows the poling of the device of FIG. 31, including the resulting poling directions of the various layers of active PZT material. Three voltages are applied: a positive voltage (Vp+) is applied to electrode 3124; a negative voltage (Vp−) is applied to electrode 3128; and ground is applied to electrode 3142. The arrows in the figure show the resulting poling directions for active PZT layers 3120, 3130, and 3140.

Returning to FIG. 31, the figure shows how the device 3100 is connected in this illustrative embodiment. Conductive epoxy 3162 bridges and thus electrically gangs electrodes 3124 and 3132, essentially taking what had been a 3-pole device during poling and changing it to a 2-pole device in operation. The ganging of electrodes could be accomplished by other well known means for making electrical connections other than conductive epoxy 3162, but using the same conductive epoxy 3162 as is used to bond the device to the suspension assembly accomplishes the ganging function without requiring a separate ganging step.

When a voltage is applied to electrode 3142 that causes main PZT layer 3120 to expand in the x-direction (from left to right) as seen in the figure due to the expansion of active area 3121, the active PZT constraining layers 3130 and 3140 will contract in the x-direction. That is, the two constraining layers 3130, 3140 tend to counteract, or act in the opposite direction, as the main PZT layer 3120.

Explained in greater detail, when the device is poled as shown in FIG. 32, and the device is electrically connected as shown in FIG. 31, the device operates as follows. A positive device activation voltage applied at electrical contact pad 158 and electrode 3142, together with electrode 3124 being grounded, causes the following reaction. The activation voltage applied to main PZT layer 3120 is the opposite of the polarity during poling. The main PZT layer 3120 therefore contracts in the z-direction and thus expands in the x-direction. At the same time, the activation voltage is of the same polarity as was applied to the two constraining layers 3130, 3140 during poling. Those PZT layers therefore expand in the z-direction and thus contact in the x-direction. The two constraining layers 3130, 3140 therefore are tending to contract while the main PZT layer 3120 is tending to expand in the relevant direction.

The effect of the constraining layers acting in the opposite direction as the main PZT layer is similar to that described earlier with respect to a passive constraining layer such as constraining layer 130 in FIG. 10, and similar restraining layers 230, 330, 430, 530, and 630 in other embodiments discussed above. The action of the active PZT restraining layers reduces the bending that would otherwise occur due to the main PZT layer and its mounting (binding) to the suspension, and can even reverse the sign of the bending, in either case increasing the net displacement caused by the microactuator as mounted.

Figure 33:
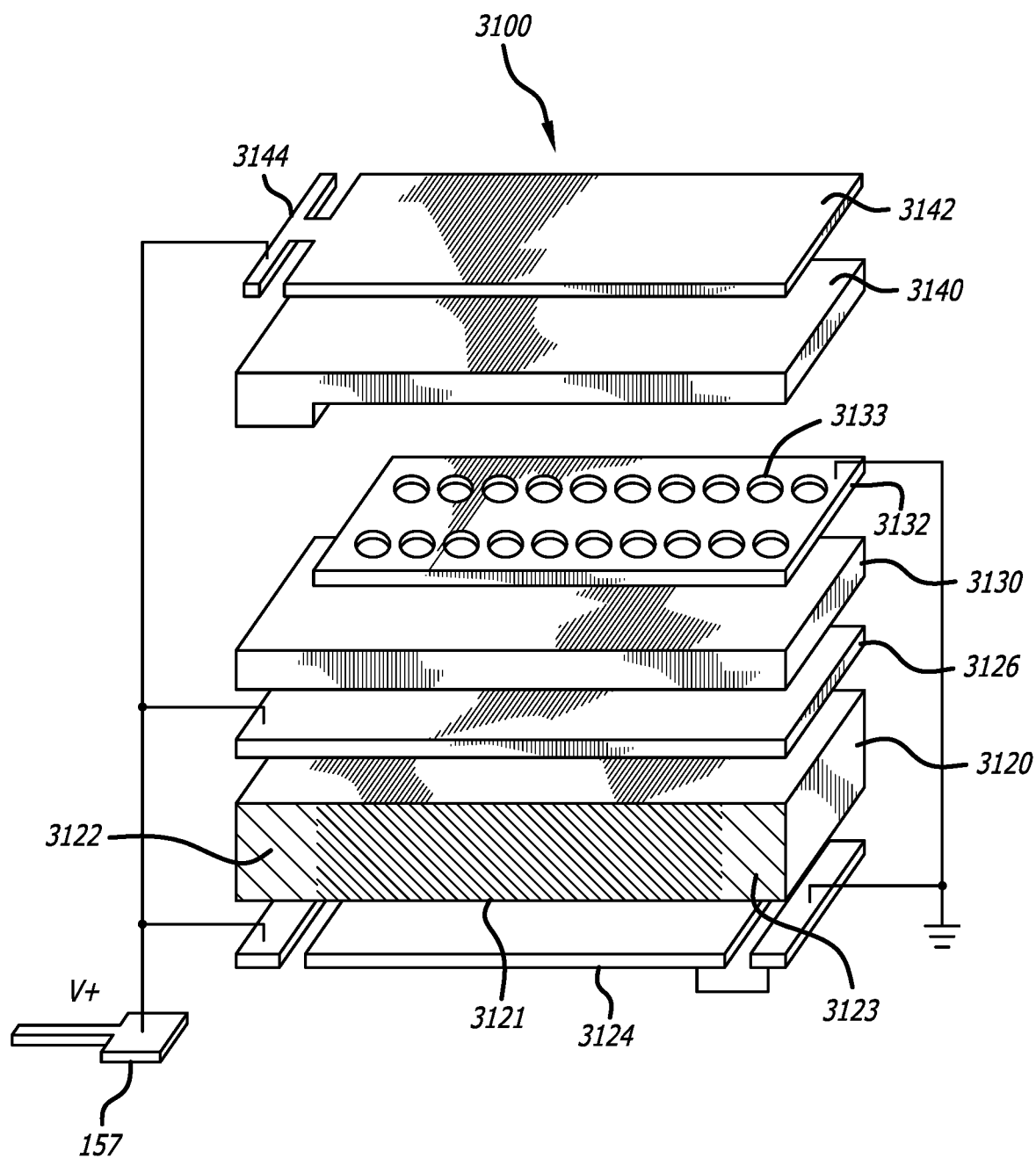
FIG. 33 is an exploded view of the microactuator assembly of FIG. 31, showing conceptually the electrical connections.

FIG. 33 is an exploded view of the microactuator assembly of FIG. 31, showing conceptually the electrical connections. Optional features that were not visible in FIG. 31 and FIG. 32 but are visible in FIG. 33 include patterning 3133 on electrode 3132 and a voltage reducer 3144 associated with electrode 3142 whose functions are described below.

A thinner microactuator assembly is desired for a number of reasons including: (1) less mass on the suspension, particularly at or near the gimbal in a gimbal-based DSA suspension which is sometimes referred to as a GSA suspension, which in turns means a greater lift-off force as measured in g-forces, i.e., a greater resistance to shock; (2) reduced windage; and (3) greater stack density within the head stack assembly which means that more data can be stored in the same volume of disk drive stack assembly space. It would thus be desirable to make the PZT constraining layers to be quite thin. However, the thinner the PZT constraining layers are, the higher the electric field strengths are across those layers during operation, and hence the more prone they are to being depoled during operation due to too high an electric field strength. Nominally, therefore, the main PZT layer and the constraining PZT layers should have the same thickness.

One solution to making the constraining PZT layers thinner without subjecting them to depoling is to reduce the strength of the electric field(s) across the constraining layer(s) using one or more of various possible means without significantly reducing the electric field across the main PZT layer. A first means for accomplishing that objective is to pattern one or more of the electrodes that is operationally associated with one of the active PZT constraining layers but is not operationally associated with the main PZT layer, such as by adding holes 3133 in electrode 3132 or other electrical voids. The patterning could also take the form of a mesh pattern such as a grid of parallel or intersecting conductors with electrical voids between them. By reducing the percentage of area of the electrical conductor within the planar electrode 3132, the electric field strength across constraining layers 3130 and 3140 are effectively reduced without reducing the electric field strength across main PZT layer 3120.

A second solution is to increase the coercive electric field strength of the constraining layer(s) so that the constraining layers are more resistant to depoling. The coercive electric field strength, or simply "coercivity" when referring to a piezoelectric material, is a measure of how great an electric field strength is required in order to depole the piezoelectric material. Making the constraining layer(s) 3130, 3140 have a higher coercivity than the main PZT layer 3120 allows those constraining layers to be made thinner without risk of depoling when subjected to the same activation voltage as the main PZT layer. The constraining layers 3130, 3140 can be made to have higher coercivities, possibly at the price of some loss of d31 stroke length or other desirable characteristics, by using a different or slightly different piezoelectric material, or by other processing.

Another solution is to reduce the effective voltage that is applied to the driven electrode associated with the constraining layer(s) by using some kind of a voltage reducer such as a voltage divider resistor network, a diode, a voltage regulator, or any one of various functionally similar devices which will occur to one of skill in the field. In the figure, generalized voltage reducer 3144 reduces the voltage received by electrode 3142, thus reducing the electric field strength experienced by constraining layer 3140 but not by main PZT layer 3120. The voltage divider can be integrally formed and thus disposed between the adjacent piezoelectric layers, such as by applying the metallization that forms the electrode layer in such as way as to form a voltage divider resistor network on the surface of the PZT material. A simple resistive voltage divider would require a ground which could be made available on the same layer. Many constructions are possible as will be apparent to designers of such devices.

Patterning 3133 and voltage reducer 3144 both decrease the strength of the electric field across constraining layer 3140, thus allowing constraining layer 3140 to be made thinner without unacceptable exposing it to depoling during operation. Either electrode patterning and/or a voltage reducer, and/or some other means for reducing the electric field strength across constraining layers 3130 and/or 3140, could be used. The patterning 3133 is integrally formed with electrode 3132 and thus is integrally formed with, and integrated into the microactuator assembly. A voltage reducer for one of the electrodes could be either integrally formed with and integrated into the assembly, or could possibly be provided external to the assembly provided that the associated electrode has its own electrical lead and is not ganged with the other electrodes.

Figure 35:
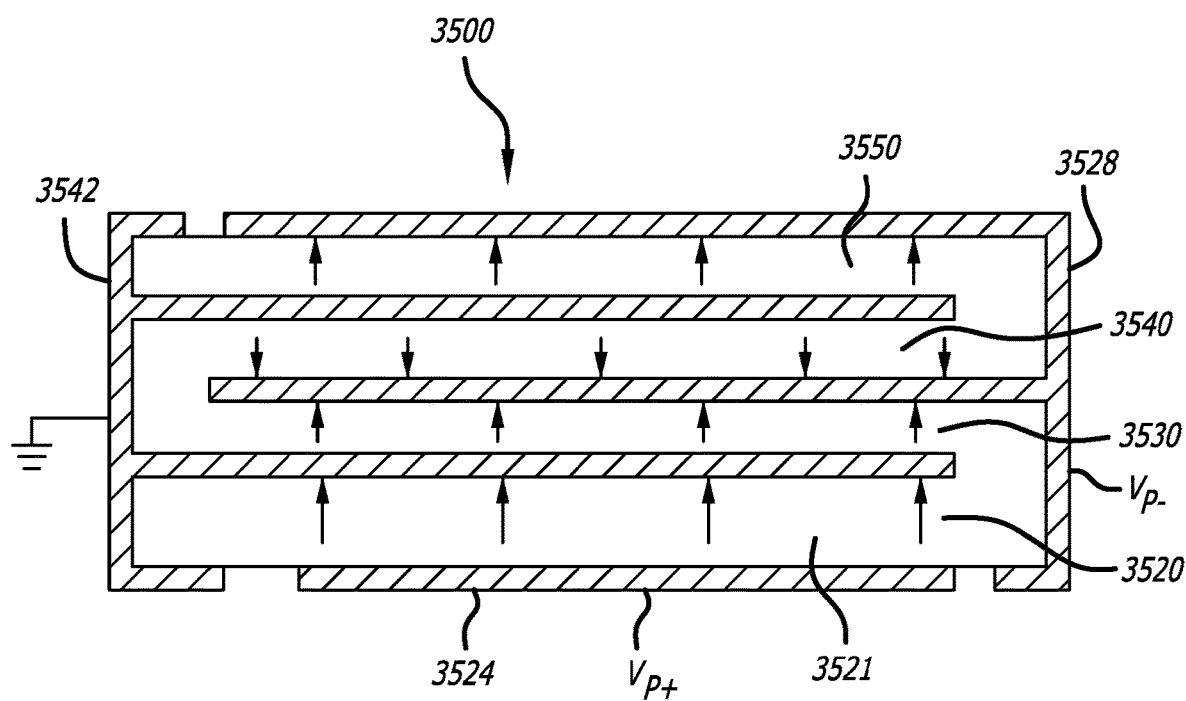
FIG. 35 is cross sectional view of another embodiment in which the microactuator assembly comprises multiple active PZT layers, and conceptually showing the poling process and the resulting poling directions.

All three of those solutions discussed above may be applied to piezoelectric microactuators having a single active constraining layer, two active constraining layers such as shown in FIGS. 31-33, or more generally n active restraining layers such as illustrated in FIG. 35.

Figure 34:
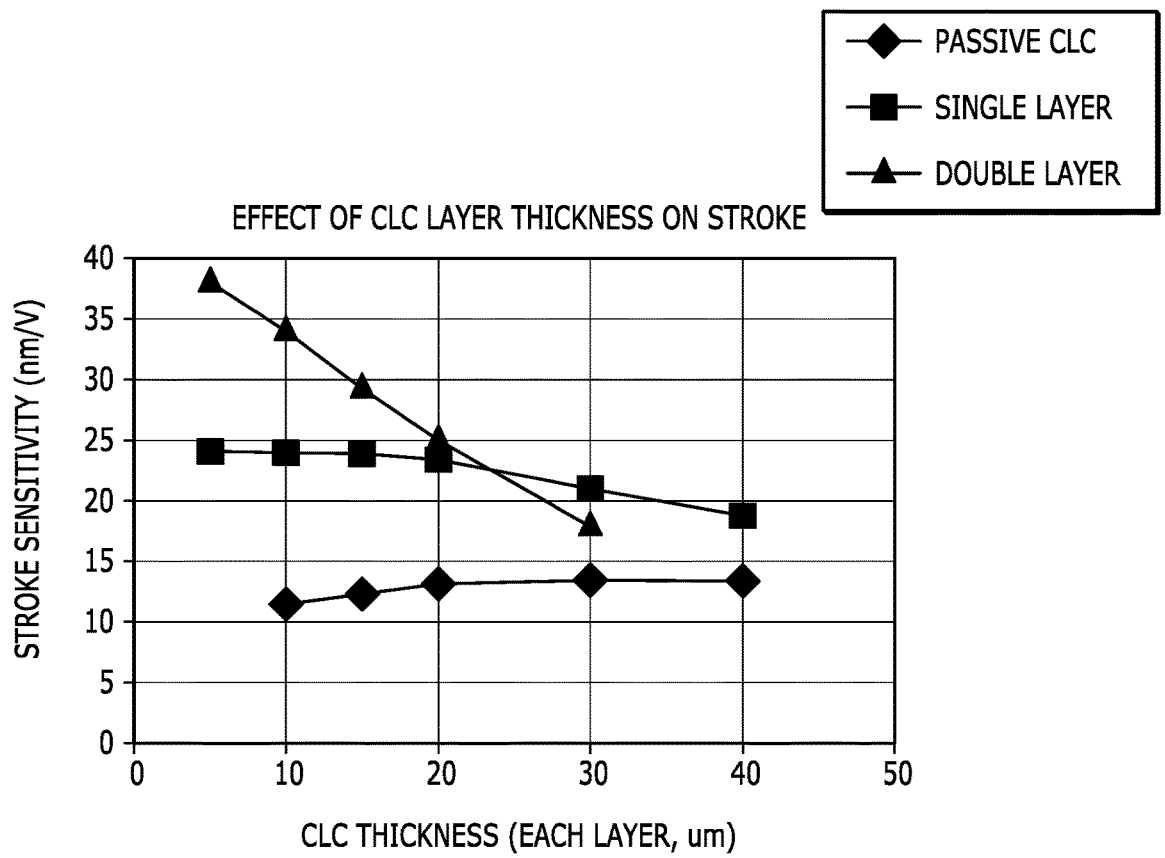
FIG. 34 is a graph showing the stroke sensitivity (in nm/V) of microactuators having one or more active restraining layers according to simulations, for various constructions.

FIG. 34 is a graph showing the stroke sensitivity (in nm/V) of microactuators having one or more active restraining layers according to simulations for various constraining layer constructions (CLC), with a main PZT layer of 45 μm thick, without any patterning 3133 or voltage reducer 3144 to decrease the electric field strength, for three different constructions:

a) one inactive restraining layer ("passive CLC," the diamond shaped data points);

b) one active restraining layer ("single layer," the square data points); and c) two active restraining layers ("double layer," the triangular data points).

The data indicates that, at least for the parameters that were studied, a PZT microactuator having one active restraining layer acting in the opposite direction as the main PZT layer always produces higher stroke sensitivity than one in which the restraining layer is inactive material. The highest stroke sensitivity is achieved using multiple active thin layers of PZT acting as restraining layers (i.e., acting in the opposite direction as the main PZT layer). Specifically, the highest stroke sensitivity was achieved using two restraining layers that were each 5 μm thick, or approximately 11% the thickness of the main PZT layer. Thus, the constraining layer is preferably less than 50% as thick as the main PZT layer, or more preferably less than 20% as thick as the main PZT layer, or more preferably still within the range of 5-15% as thick as the main PZT layer.

For two active restraining layers, the stroke sensitivity decreases dramatically with increasing thickness of the restraining layers, with the highest stroke sensitivity for the case of two active constraining layers each of about 5 μm thick. Thus, the microactuator preferably has two or more restraining layers of a combined thickness that is less than the thickness of the main PZT layer, and more preferably their combined thickness is less than 50% the thickness of the main PZT layer, and more preferably still each constraining layer is less than half as thick as the main PZT layer, and more preferably still each constraining layer is less than 20% as thick as the main PZT layer, and more preferably still each constraining layer is within the range of 5-15% as thick as the main PZT layer.

For a microactuator assembly having a single active restraining layer, the loss in stroke sensitivity as the restraining layer thickness increases was not nearly as dramatic as for the case of two active restraining layers. A local maxima occurs at about 10 μm thickness for the single active restraining layer. Thus, for a microactuator assembly having a single active restraining layer, the thickness of that layer is preferably in the range of 10-40% as thick as the main PZT layer, and more preferably in the range of about 10-20% as thick as the main PZT layer.

FIG. 35 is cross sectional view of another embodiment in which the microactuator assembly comprises multiple active PZT layers, and conceptually showing the poling process and the resulting poling directions. When the device of FIG. 35 is electrically and mechanically bonded to a suspension such as shown in FIG. 31 with electrodes 3524 and 3528 ganged by conductive epoxy, the result is one main active PZT layer, and three active PZT layers acting as restraining layers because they tend to act in the opposite direction as the main active PZT layer. That is, the bottom PZT layer expands while the top three PZT layers contract, or vice versa.

The construction of the microactuator assembly can be easily extended from a device having one active main PZT layer and two active PZT restraining layers as shown in FIGS. 31-33, and one active main PZT layer and three active PZT restraining layers shown in FIG. 35, to any number of active main layers and active restraining layers. The electric field strength across one or more of the constraining layers can be reduced by various means including electrode patterning and/or a voltage reducer. Experimentation will reveal optimal numbers of constraining layers and optimal thicknesses for different applications.

The PZT microactuators disclosed herein can be used as actuators in fields other than disk drive suspensions. Such microactuators and their construction details therefore constitute inventive devices regardless of what environment they are used it, be that environment the disk drive suspension environment or any other environment.

It will be understood that the terms "generally," "approximately," "about," "substantially," and "coplanar" as used within the specification and the claims herein allow for a certain amount of variation from any exact dimensions, measurements, and arrangements, and that those terms should be understood within the context of the description and operation of the invention as disclosed herein.

It will further be understood that terms such as "top," "bottom," "above," and "below" as used within the specification and the claims herein are terms of convenience that denote the spatial relationships of parts relative to each other rather than to any specific spatial or gravitational orientation. Thus, the terms are intended to encompass an assembly of component parts regardless of whether the assembly is oriented in the particular orientation shown in the drawings and described in the specification, upside down from that orientation, or any other rotational variation.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise. Thus, unless expressly stated otherwise, each feature disclosed is one example only of a generic series of equivalent or similar features.

It will be appreciated that the term "present invention" as used herein should not be construed to mean that only a single invention having a single essential element or group of elements is presented. Similarly, it will also be appreciated that the term "present invention" encompasses a number of separate innovations which can each be considered separate inventions. Although the present invention has thus been described in detail with regard to the preferred embodiments and drawings thereof, it should be apparent to those skilled in the art that various adaptations and modifications of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents.

We claim:

1. A multi-layer piezoelectric microactuator assembly for effecting fine positional movements, the microactuator assembly comprising:
    a first piezoelectric layer and a second piezoelectric layer, the first piezoelectric layer being closest to a surface to which the microactuator assembly is bonded;
    a first electrode on a bottom side of the first piezoelectric layer;
    a second electrode on a top side of the first piezoelectric layer and disposed underneath the second piezoelectric layer, there being no electrode between the first and second electrodes such that a distance between the first and second electrodes defines a thickness of the first piezoelectric layer, and such that a voltage applied across the first and second electrodes induces an electric field across the first piezoelectric layer thereby causing the first piezoelectric layer to expand or contract;
    a third electrode on a top side of the second piezoelectric layer, there being no electrode between the second and third electrodes such that a distance between the second and third electrodes defines a thickness of the second piezoelectric layer, and such that a voltage applied across the second and third electrodes induces an electric field across the second piezoelectric layer thereby causing the second piezoelectric layer to expand or contract;
    a third piezoelectric layer adjacent the second piezoelectric layer on a side thereof opposite the first piezoelectric layer; and
    a fourth electrode on a top side of the third piezoelectric layer, with the third electrode separating the second and third piezoelectric layers, there being no electrode between the third and fourth electrodes such that a distance between the third and fourth electrodes defines a thickness of the third piezoelectric layer, and such that a voltage applied across the third and fourth electrodes induces an electric field across the third piezoelectric layer thereby causing the third piezoelectric layer to expand or contract;
    wherein the second piezoelectric layer comprises the same material as the first piezoelectric layer and is thinner than the first piezoelectric layer; and
    wherein in response to the microactuator activation voltage, the second and third piezoelectric layers both tend to act in an opposite direction from an action of the first piezoelectric layer.

2. The microactuator assembly of claim 1 wherein the second and third piezoelectric layers are each thinner than the first piezoelectric layer.

3. The microactuator assembly of claim 1 wherein the second and third piezoelectric layers each have a thickness in the range of 5-15% of a thickness of the first piezoelectric layer.

4. A multi-layer piezoelectric microactuator assembly for effecting fine positional movements, the microactuator assembly comprising:
    a first piezoelectric layer and a second piezoelectric layer, the first piezoelectric layer being closest to a surface to which the microactuator assembly is bonded;
    a first electrode on a bottom side of the first piezoelectric layer;
    a second electrode on a top side of the first piezoelectric layer and disposed underneath the second piezoelectric layer, there being no electrode between the first and second electrodes such that a distance between the first and second electrodes defines a thickness of the first piezoelectric layer, and such that a voltage applied across the first and second electrodes induces an electric field across the first piezoelectric layer thereby causing the first piezoelectric layer to expand or contract; and
    a third electrode on a top side of the second piezoelectric layer, there being no electrode between the second and third electrodes such that a distance between the second and third electrodes defines a thickness of the second piezoelectric layer, and such that a voltage applied across the second and third electrodes induces an electric field across the second piezoelectric layer thereby causing the second piezoelectric layer to expand or contract;
    wherein the second piezoelectric layer comprises the same material as the first piezoelectric layer and is thinner than the first piezoelectric layer; and
    wherein the first and second piezoelectric layers are poled such that when a microactuator activation voltage is applied to the microactuator assembly, the first and second piezoelectric layers tend to act in opposite directions; and
    wherein two of said electrodes are electrically ganged by conductive adhesive that bonds the microactuator assembly to said surface.

5. The microactuator assembly of claim 4 further comprising:
    a third piezoelectric layer adjacent the second piezoelectric layer on a side thereof opposite the first piezoelectric layer; and
    a fourth electrode on a top side of the third piezoelectric layer, with the third electrode separating the second and third piezoelectric layers, there being no electrode between the third and fourth electrodes such that a distance between the third and fourth electrodes defines a thickness of the third piezoelectric layer, and such that a voltage applied across the third and fourth electrodes induces an electric field across the third piezoelectric layer thereby causing the third piezoelectric layer to expand or contract;
    wherein in response to the microactuator activation voltage, the second and third piezoelectric layers both tend to act in an opposite direction from an action of the first piezoelectric layer.

6. The microactuator assembly of claim 5 wherein the second and third piezoelectric layers are each thinner than the first piezoelectric layer.

7. The microactuator assembly of claim 5 wherein the second and third piezoelectric layers each have a thickness in the range of 5-15% of a thickness of the first piezoelectric layer.

8. The microactuator assembly of claim 4 wherein when the microactuator activation voltage is applied to the microactuator assembly, the microactuator assembly acts in the direction of the first piezoelectric layer a greater overall distance than if the second piezoelectric layer were not present.

9. The microactuator assembly of claim 4 wherein the second piezoelectric layer is less than 50% as thick as the first piezoelectric layer.

10. The microactuator assembly of claim 4 wherein the second and third piezoelectric layers are each less than 20% as thick as the first piezoelectric layer.

11. The microactuator assembly of claim 4 wherein the second piezoelectric layer has a higher coercivity than does the first piezoelectric layer.

12. The microactuator assembly of claim 4 further comprising means for reducing an electric field strength across the second piezoelectric layer but not the first piezoelectric layer.

13. A multi-layer piezoelectric microactuator assembly for effecting fine positional movements, the microactuator assembly comprising:
   a first piezoelectric layer, the first piezoelectric layer tending to act in a first linear direction when a voltage is applied across a pair of electrodes of the microactuator assembly;
   a plurality of opposing piezoelectric layers bonded to the first piezoelectric layer, the first piezoelectric layer and the plurality of opposing piezoelectric layers being disposed in stacked planar relationships to one other, the first piezoelectric layer being disposed closer to a surface to which the microactuator assembly is bonded; and
   conductive electrode layers disposed between respective pairs of said piezoelectric layers including between pairs of adjacent opposing piezoelectric layers;
   wherein the opposing piezoelectric layers are poled so that they act in a linear direction generally opposite the first linear direction when said voltage is applied across said pair of electrodes; and
   wherein two of said electrodes are electrically ganged by conductive adhesive that bonds the microactuator assembly to said surface.

14. The microactuator assembly of claim 13 further comprising means for reducing an electric field strength across at least one of the opposing piezoelectric layers, the means for reducing electric field strength being integrally formed with the piezoelectric microactuator assembly.

15. A multi-layer piezoelectric microactuator assembly for effecting fine positional movements, the microactuator assembly comprising:
   a first piezoelectric layer adjacent a surface to which the microactuator assembly is bonded; and
   a plurality of restraining piezoelectric layers bonded to the first piezoelectric layer, each of the restraining piezoelectric layers being farther away from said surface, each of the piezoelectric restraining layers having an associated pair of electrodes with one electrode disposed between adjacent restraining piezoelectric layers, the restraining piezoelectric layers tending to act in an opposite direction as the first piezoelectric layer when a microactuator activation voltage is applied to the microactuator assembly; and
   wherein two of said electrodes are electrically ganged by conductive adhesive that bonds the microactuator assembly to said surface.

16. The microactuator assembly of claim 15 wherein when the microactuator activation voltage is applied to the microactuator assembly, the microactuator assembly acts in the direction of the first piezoelectric layer a greater overall distance than if the plurality of restraining piezoelectric layers were not present.

17. The microactuator assembly of claim 15 wherein each of the restraining piezoelectric layers is thinner than the first piezoelectric layer.

18. The microactuator assembly of claim 15 wherein each of the restraining piezoelectric layers is less than 50% as thick as the first piezoelectric layer.

* * * * *